US008864501B2

(12) United States Patent
Lin et al.

(10) Patent No.: US 8,864,501 B2

(45) Date of Patent: Oct. 21, 2014

(54) BOARD MOUNTED ELECTRICAL CONNECTOR

(75) Inventors: Jeng-de Lin, Yorkville, IL (US); Jason E. Squire, Batavia, IL (US); Scott D. Sommers, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 1072 days.

(21) Appl. No.: 12/674,559

(22) PCT Filed: Aug. 22, 2008

(86) PCT No.: PCT/US2008/010067

§ 371 (c)(1), (2), (4) Date: Jan. 21, 2011

(87) PCT Pub. No.: WO2009/025868

PCT Pub. Date: Feb. 26, 2009

(65) Prior Publication Data

US 2011/0104915 A1 May 5, 2011

Related U.S. Application Data

(60) Provisional application No. 60/957,657, filed on Aug. 23, 2007.

(51) Int. Cl.

| | |
|---|---|
| ***H01R 12/00*** | (2006.01) |
| ***H05K 1/00*** | (2006.01) |
| ***H01R 13/658*** | (2011.01) |
| ***H01R 13/6477*** | (2011.01) |
| ***H01R 13/6471*** | (2011.01) |

(52) U.S. Cl.

CPC ...... *H01R 13/65807* (2013.01); *H01R 13/6477* (2013.01); *H01R 13/6471* (2013.01); *Y10S 439/941* (2013.01)

USPC ........................... 439/79; 439/607.4; 439/941

(58) Field of Classification Search

CPC ............. H01R 23/688; H01R 23/6873; H01R 23/7073

USPC .................. 439/108, 79, 941, 607.4, 607.34, 439/607.32

See application file for complete search history.

(56) References Cited

U.S. PATENT DOCUMENTS 4,337,989 A 7/1982 Asick et al.
4,628,410 A 12/1986 Goodman et al.

(Continued)

FOREIGN PATENT DOCUMENTS

CN 200520000607.6 1/2005
EP 0 486 298 A1 5/1992

(Continued)

OTHER PUBLICATIONS

Meeting Minutes from VESA Flat Panel Display Interface Committee, Jun. 13, 1996, VESA Doc # FPD 96/43.

(Continued)

*Primary Examiner* — Hae Moon Hyeon

(74) *Attorney, Agent, or Firm* — Stephen L. Sheldon

(57) ABSTRACT

A connector includes an insulator, and a plurality of spaced apart signal contacts and return reference contacts which are held by and routed through the insulator. The signal contacts form signal pairs which include a positive signal contact and a negative signal contact. At a first end of the insulator, the signal pairs and return reference contacts are provided in two rows. At the second end of the insulator, the signal pairs and return reference contacts are provided in at least three rows. The signal pairs and return reference contacts form either a plurality of isosceles triangles or a plurality of diagonal lines.

12 Claims, 22 Drawing Sheets

(56) References Cited

U.S. PATENT DOCUMENTS

| | | | | |
|---|---|---|---|---|
| 4,678,121 | A | 7/1987 | Douty et al. | |
| 4,717,354 | A | 1/1988 | McCleerey | |
| 4,790,765 | A | 12/1988 | Ehrenfels et al. | |
| 4,824,383 | A | 4/1989 | Lemke | |
| 4,981,447 | A | 1/1991 | Ichitsubo | |
| 5,046,960 | A | 9/1991 | Fedder | |
| 5,256,085 | A | 10/1993 | Tan et al. | |
| 5,281,169 | A | 1/1994 | Kiat et al. | |
| 5,490,786 | A | 2/1996 | Mosquera et al. | |
| 5,525,067 | A | 6/1996 | Gatti | |
| 5,725,400 | A | 3/1998 | Morikawa et al. | |
| 5,876,248 | A | 3/1999 | Brunker et al. | |
| 5,895,276 | A | 4/1999 | Rothenberger | |
| 5,954,541 | A | 9/1999 | Ozai et al. | |
| 6,007,352 | A | 12/1999 | Azuma et al. | |
| 6,116,926 | A | 9/2000 | Ortega et al. | |
| 6,139,371 | A | 10/2000 | Troutman et al. | |
| 6,142,804 | A | 11/2000 | Peloza et al. | |
| 6,164,995 | A | 12/2000 | Peloza | |
| 6,280,209 | B1 | 8/2001 | Bassler et al. | |
| 6,350,134 | B1 * | 2/2002 | Fogg et al. | 439/79 |
| 6,575,789 | B2 | 6/2003 | Bassler et al. | |
| 6,935,870 | B2 | 8/2005 | Kato et al. | |
| 6,945,796 | B2 | 9/2005 | Bassler et al. | |
| 7,270,570 | B1 * | 9/2007 | Hamner et al. | 439/607.04 |
| 7,435,107 | B2 | 10/2008 | Masumoto et al. | |
| 7,448,884 | B2 * | 11/2008 | Kato et al. | 439/108 |
| 8,506,332 | B2 * | 8/2013 | Sommers et al. | 439/607.34 |
| 2002/0123254 | A1 * | 9/2002 | Kato et al. | 439/108 |
| 2004/0092143 | A1 | 5/2004 | Fromm et al. | |

FOREIGN PATENT DOCUMENTS

| | | | | |
|---|---|---|---|---|
| EP | 0 529 350 | A2 | 3/1993 | |
| EP | 0 793 297 | A2 | 9/1997 | |
| EP | 0 836 247 | A2 | 4/1998 | |
| JP | 06-104030 | | 4/1994 | |
| JP | 11-067389 | | 3/1999 | |
| JP | 2002-246121 | | 8/2002 | |
| JP | 2002-334748 | | 11/2002 | |
| JP | 2004-534358 | | 11/2004 | |
| JP | 2005-293970 | | 10/2005 | |
| JP | 2005-531121 | | 10/2005 | |
| JP | 2005293970 | A * | 10/2005 | H01R 13/658 |
| JP | 2007-141619 | | 6/2007 | |
| JP | 2007-179960 | | 7/2007 | |
| WO | WO 89/11169 | A1 | 11/1989 | |
| WO | 96/19850 | A1 | 6/1996 | |
| WO | WO 00/10228 | A1 | 2/2000 | |

OTHER PUBLICATIONS

Presentation by Don Chambers of JAE Electronics, Inc., "Considerations for Connectors for the Vesa Flat Panel Display Interface-2," VESA Doc # FPDI 96/39, date perhaps Jun. 13, 1996.

Presentation by JAE Electronics, Inc., "I/O Connector for LCD Display FI Series (for Vesa FPDI-2)," VESA Doc # FPDI 91/22, date believed to be Feb. 13, 1997.

International Search Report for PCT/US2008/010067.

* cited by examiner

BOARD MOUNTED ELECTRICAL CONNECTOR

This application claims the domestic benefit of U.S. Provisional Application Ser. No. 60/957,657 filed on Aug. 23, 2007, which disclosure is hereby incorporated by reference in its entirety.

FIELD OF THE INVENTION

This invention relates to a board mounted electrical connector and, in particular, to a connector suitable for use in high speed I/O connectors, including High-Definition Multimedia Interface (HDMI) type connectors.

BACKGROUND OF THE INVENTION

U.S. Pat. No. 6,935,870 provides a connector which include a plurality of contact arrays formed in a grid. This patent discloses two different arrangements for the contacts. In the first arrangement, the connector includes a plurality of contact arrays parallel to one another. Each of the contact arrays includes two signal contacts adjacent to each other and a ground contact aligned with the signal contacts. In each contact array, the ground contact is located at a position corresponding to an intermediate position between two signal contacts in a next contact array. In the second arrangement, the connector includes a plurality of contacts which includes first and second contact arrays parallel to each other and a third contact array between the first and the second contact arrays. Each of the first and the second contact arrays includes a plurality of signal contacts, and the third contact array includes a plurality of ground contacts. Each of the ground contacts is disposed at a position corresponding to an intermediate position between every adjacent ones of the signal contacts in each of the first and the second contact arrays.

This second arrangement of the contacts in U.S. Pat. No. 6,935,870 does not provide for a great distance between the ground contacts since the ground contacts are all provided on the same row. In addition, the second arrangement in U.S. Pat. No. 6,935,870 does not provide for a great distance between adjacent pairs of signal contacts since the signal contacts are provided on the same row. As a result, cross-talk between signal contact pairs is possible.

The present invention provides a connector which overcomes the problems presented in the prior art and which provides additional advantages over the prior art, such advantages will become clear upon a reading of the attached specification in combination with a study of the drawings.

SUMMARY OF THE INVENTION

Briefly, the present invention discloses a connector includes an insulator, and a plurality of spaced apart signal contacts and return reference contacts which are held by and routed through the insulator. The signal contacts form signal pairs which include a positive signal contact and a negative signal contact. At a first end of the insulator, the signal pairs and return reference contacts are provided in two rows. At the second end of the insulator, the signal pairs and return reference contacts are provided in at least three rows. The signal pairs and return reference contacts form either a plurality of isosceles triangles or a plurality of diagonal lines.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENTS

Figure 1:
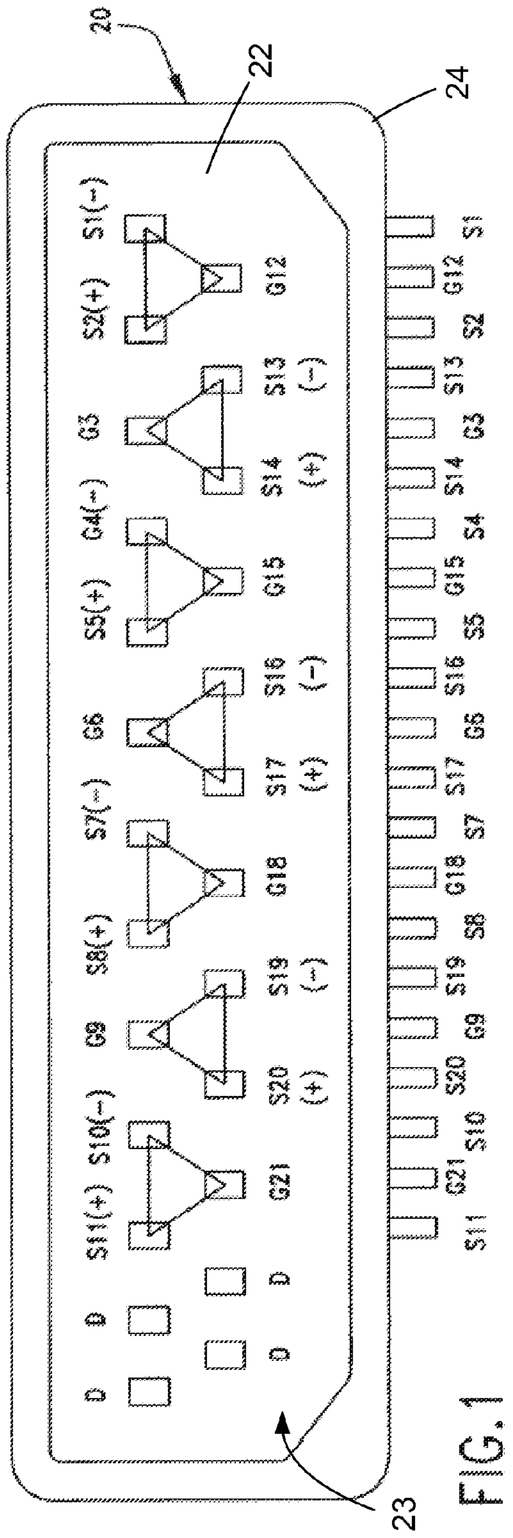
FIG. 1 is front elevational view of a board mounted electrical connector which incorporates the features of the present invention.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

A board mounted electrical connector 20 includes a plurality of spaced apart signal contacts S, return reference contacts G, which in the preferred embodiment are ground contacts, and power contacts D, an insulator 22 holding the signal contacts S, the return reference contacts G, and the power contacts and a receptacle shell 24 surrounding all of these components. The receptacle shell 24 has an upper surface adapted to be engaged with a plug connector. Each pair of the signal contacts S adjacent to each other includes a positive (+) signal contact and a negative (−) signal contact, thereby defining a signal pair.

The contacts of the above-mentioned three types (signal, return reference, and power) are disposed in a specific arrangement. As shown in FIG. 1, on a front face 23 of the connector 20, in an upper row the contacts are arranged in the order of S, S, G, S, S, G, S, S, G, S, S from the right side. In a lower row the contacts are arranged in the order of G, S, S, G, S, S, G, S, S, G from the right side. For convenience in explaining the routing of the contacts, the contacts are numbered from 1 to 21, along with an S or a G to denote the type of contact. The power contacts D are also provided in the rows, usually at the ends. The signal contacts S, S adjacent to each other in the upper row and the return reference contact G in the lower row are located at three apexes of an isosceles triangle as shown by the lines in FIG. 1 (it is to be understood that the lines do not represent electrical connections and merely shows the isosceles triangle formation). Likewise, the return reference contact G in the upper row and the signal contacts S, S adjacent to each other in the lower row are located at three apexes of an isosceles triangle. At the other end of the receptacle shell 24, the contacts are routed such that three rows are provided, identified as upper row A, middle row B and lower row C; or the contacts are routed such that four rows are provided, identified as upper first row A, second row B, third row C, and lower last row D; or the contacts are routed such that five rows are provided, identified as upper first row A, second row B, third row C, fourth row D and lower last row E. This arrangement of the contacts on the front side of the connector 20 is identical to that shown in the first arrangement discussed above and shown in U.S. Pat. No. 6,935,870 which disclosure is herein incorporated by reference.

Figure 2:
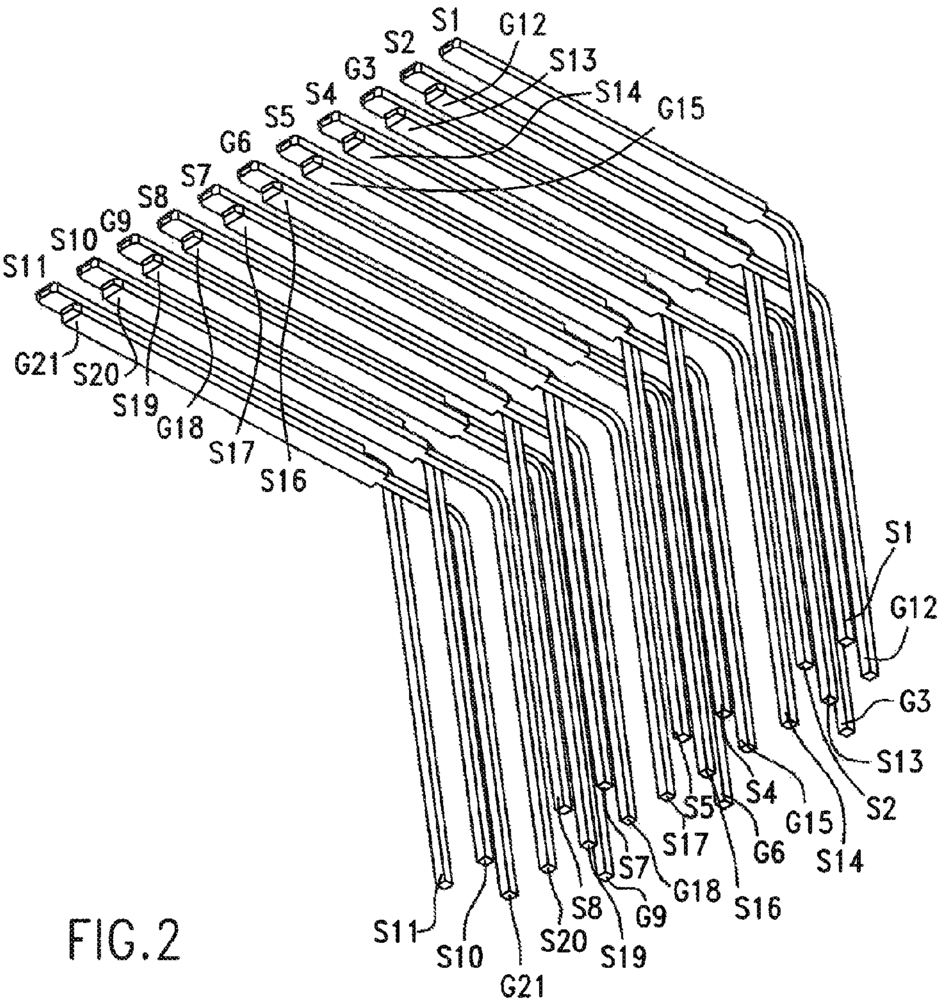
FIG. 2 is a perspective of the contacts shows the routing of the contacts through a receptacle shell and an insulator, which have been removed for sake of clarity, according to a first embodiment of the invention.
Figure 3:
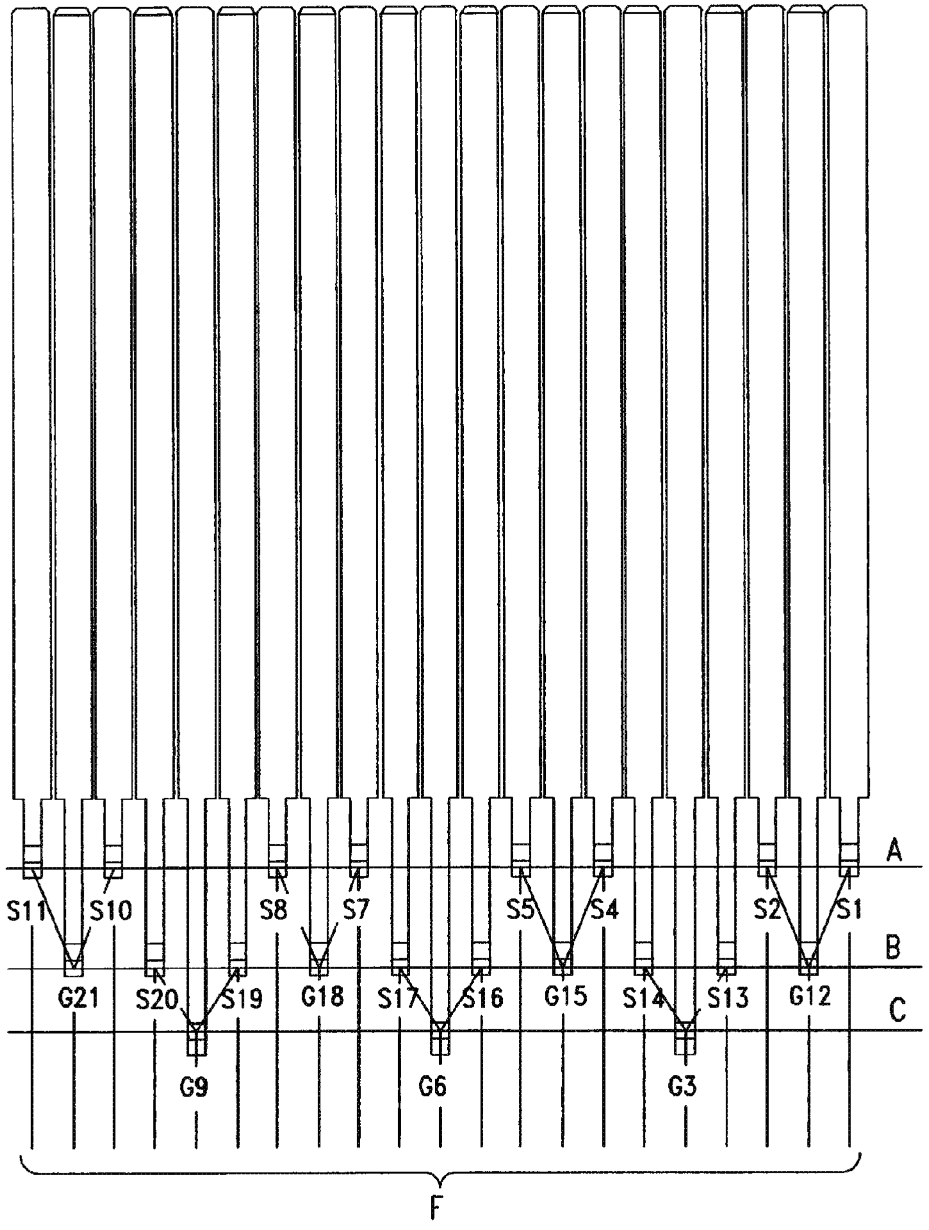
FIG. 3 shows a bottom plan view of the contacts of FIG. 2 showing the orientation of the contacts as they exit the rear side of the connector.

In a first embodiment as shown in FIGS. 2 and 3, FIG. 2 shows the routing of the contacts through the receptacle shell 24 and the insulator 22, which have been removed for sake of clarity, and FIG. 3 shows a bottom view of the connector 20 showing the orientation of the contacts G, S as they exit the rear side of the connector 20. The contacts G, S are again numbered 1 to 21 and this numbering corresponds to the numbering of FIG. 1. As such, it can be seen that the return reference contacts G and the signal contacts S, S are provided in a grid form which includes three rows A, B, C and a plurality of columns F which are perpendicular to the rows A, B, C. The respective signal contacts S are the only contacts provided in their respective column F and the respective return reference contacts G are the only contacts provided in their respective column F. The return reference contacts G alternate between the middle row B and the lower row C; and the adjacent signal contacts S, S alternate between the upper row A and the middle row B. Each pair of signal contacts S, S and the associated return reference contact G form the apexes of an isosceles triangle as shown by the lines in FIG. 3 (it is to be understood that the lines do not represent electrical connections and merely show the isosceles triangle formation). This provides for a greater distance between return reference contacts G than if the return reference contacts G were all provided on the same row; this provides for a greater distance between adjacent pairs of signal contacts S, S than if the adjacent pairs of signal contacts S, S were all provided on the same row. As a result, the cross-talk between adjacent signal contact pairs S, S is reduced than if the adjacent pairs of signal contacts S, S were all provided on the same row. In addition, because the return reference contact G is between the signal contacts S, S in the respective signal contact pairs, an improved electrical coupling, more uniform impedance, and a reduction in cross-talk between the signal contacts S, S in the respective signal contact pairs is achieved. The contacts G, S can be soldered to a plated through hole in an associated printed wiring board (not shown).

Figure 4:
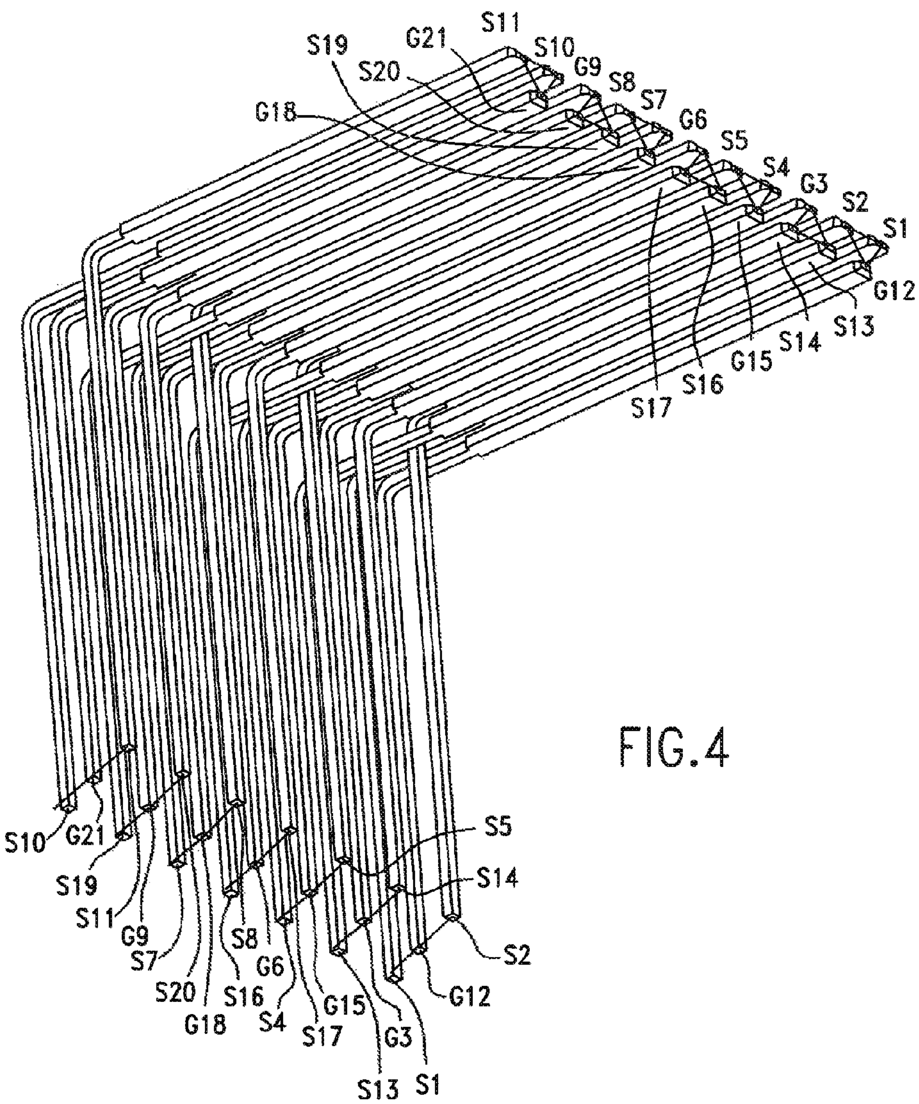
FIG. 4 is a perspective of the contacts shows the routing of the contacts through a receptacle shell and an insulator, which have been removed for sake of clarity, according to a second embodiment of the invention.
Figure 5:
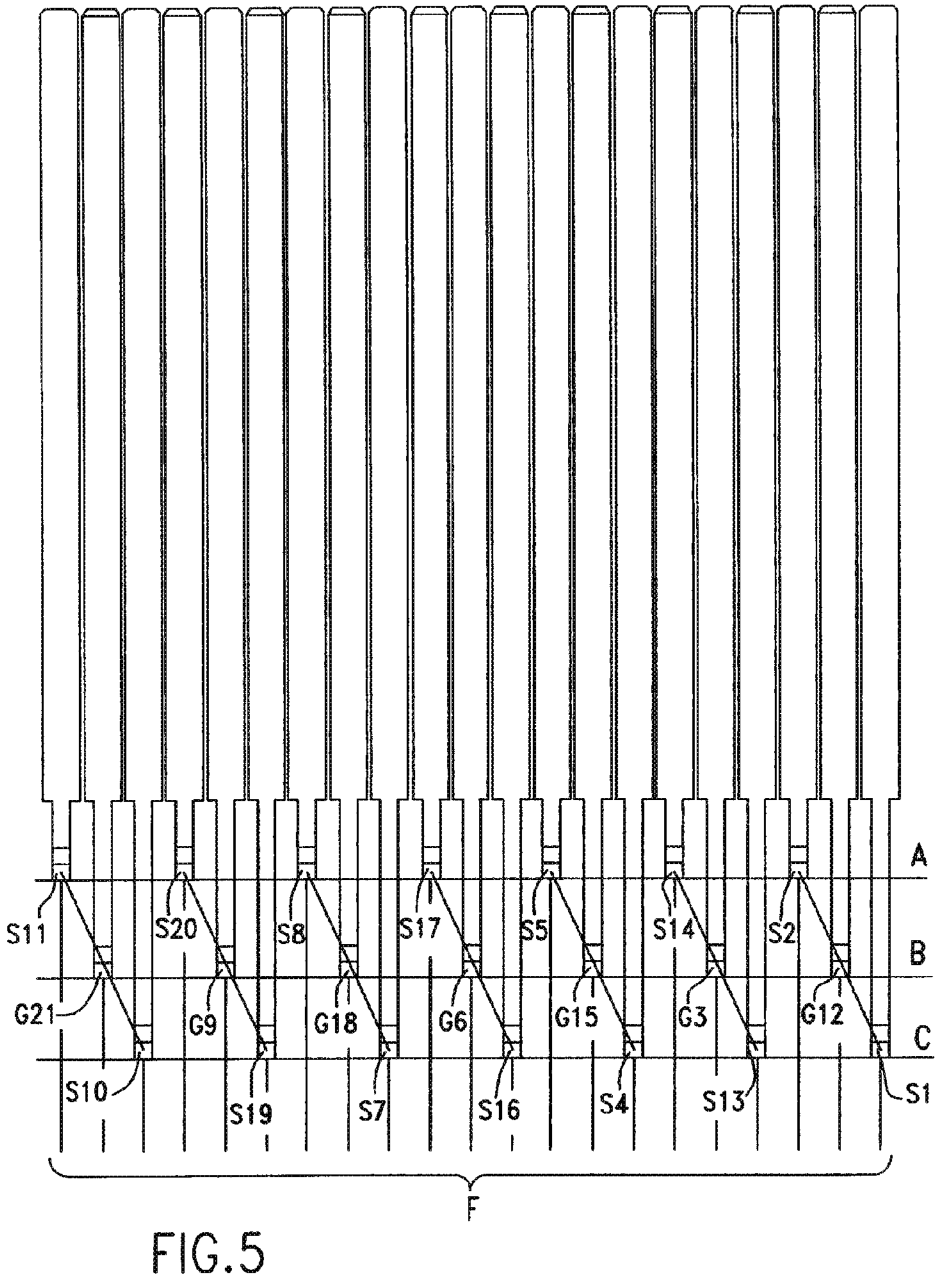
FIG. 5 shows a bottom plan view of the contacts of FIG. 4 showing the orientation of the contacts as they exit the rear side of the connector.

In a second embodiment as shown in FIGS. 4 and 5, FIG. 4 shows the routing of the contacts through the receptacle shell 24 and the insulator 22, which have been removed for sake of clarity, and FIG. 5 shows a bottom view of the connector 20 showing the orientation of the contacts G, S as they exit the rear side of the connector 20. The contacts G, S are again numbered 1 to 21 and this numbering corresponds to the numbering of FIG. 1. As such, it can be seen that the return reference contacts G and the signal contacts S, S are provided in a grid form which includes three rows A, B, C and a plurality of columns F which are perpendicular to the rows A, B, C. The respective signal contacts S are the only contacts provided in their respective column F and the respective return reference contacts G are the only contacts provided in their respective column F. The return reference contacts G are all on middle row B; and the adjacent pairs of signal contacts S, S alternate between upper row A and the lower row C to form three points which form a diagonal line as shown in FIG. 5 (it is to be understood that the lines do not represent electrical connections and merely show the diagonal line formation). This provides for a greater distance between adjacent pairs of signal contacts S, S than if the adjacent pairs of signal contacts S, S were all provided on the same row. In addition, all of the same polarity, for example positive, contacts are on the upper row A and all of the same polarity, for example negative, contacts are on the lower row C. As a result, the cross-talk between adjacent signal pairs S, S is reduced than if the adjacent pairs of contacts were all provided on the same row. In addition, because the return reference contact G is between the signal contacts S, S in the respective signal pairs, an improved electrical coupling, more uniform impedance, and a reduction in cross-talk between the signal contacts S, S in the respective signal pairs is achieved. The contacts G, S can be soldered to a plated through hole in an associated printed wiring board (not shown).

Figure 8A:
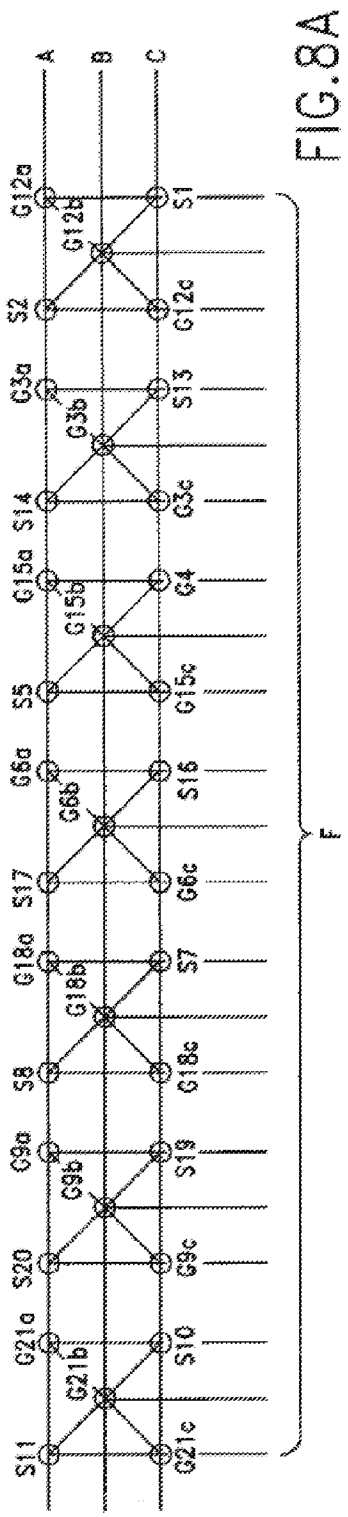
FIG. 8A is a schematic view of an alternate, fourth embodiment of the contacts of FIG. 6 showing the orientation of the contacts as they exit the rear side of the connector.
Figure 6:
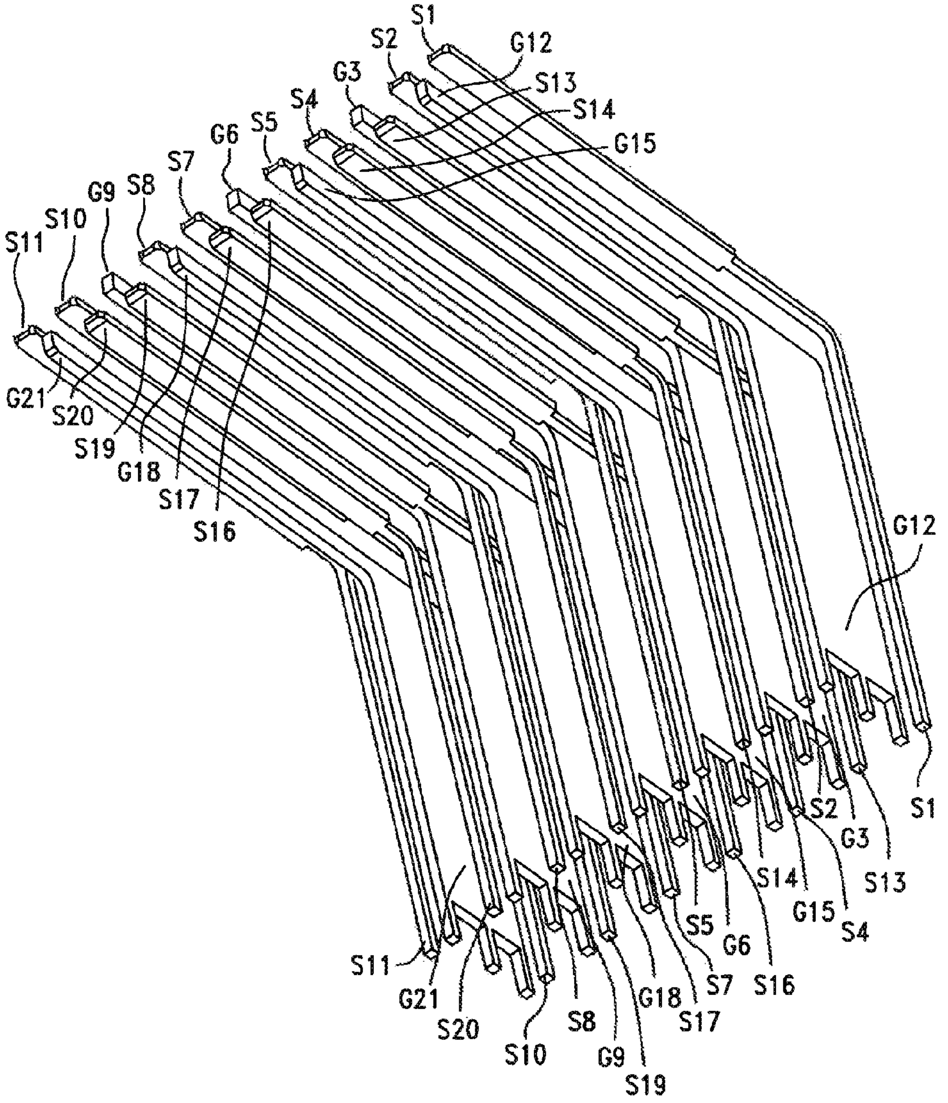
FIG. 6 is a perspective of the contacts shows the routing of the contacts through a receptacle shell and an insulator, which have been removed for sake of clarity, according to a third embodiment of the invention.
Figure 7:
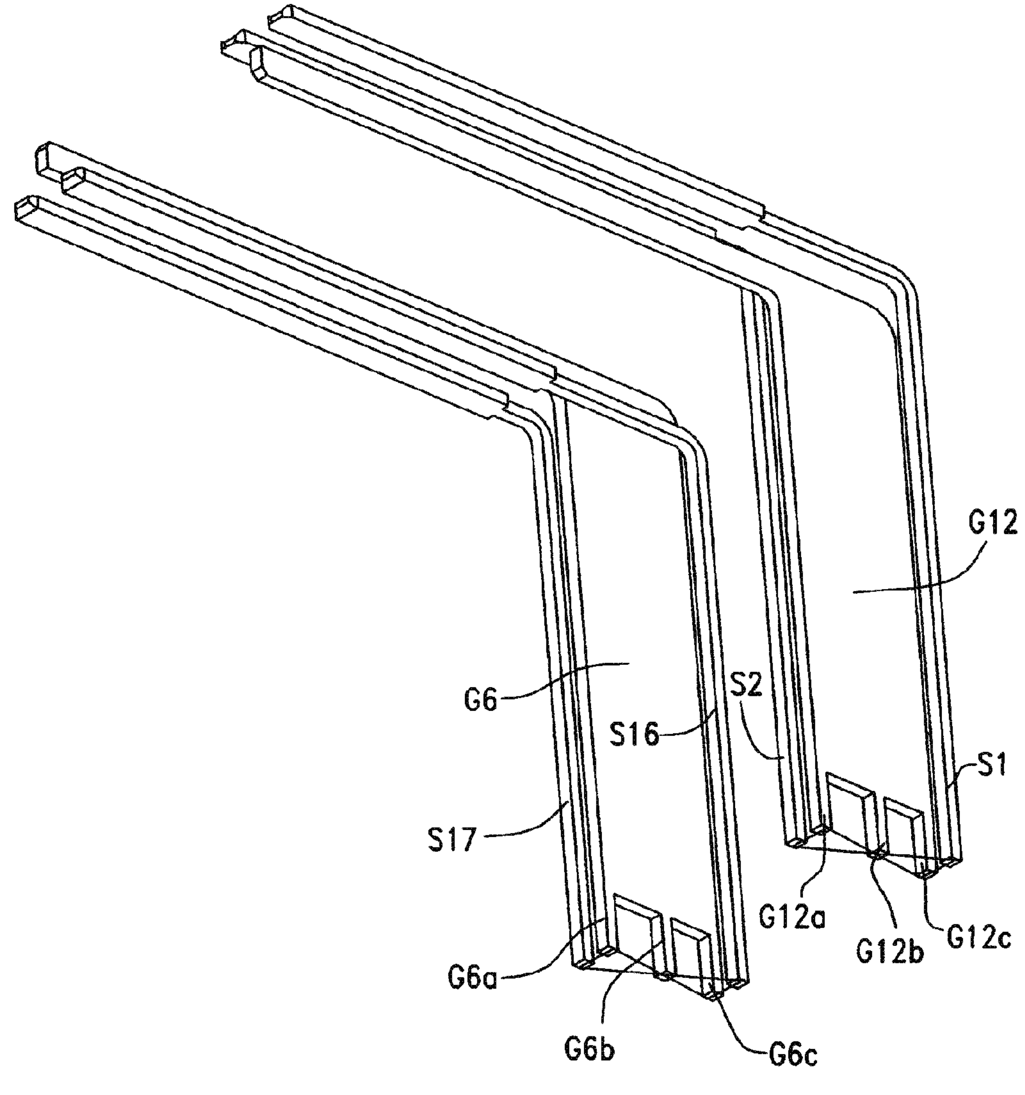
FIG. 7 is a perspective of two sets of the contacts shown in FIG. 6.
Figure 8:
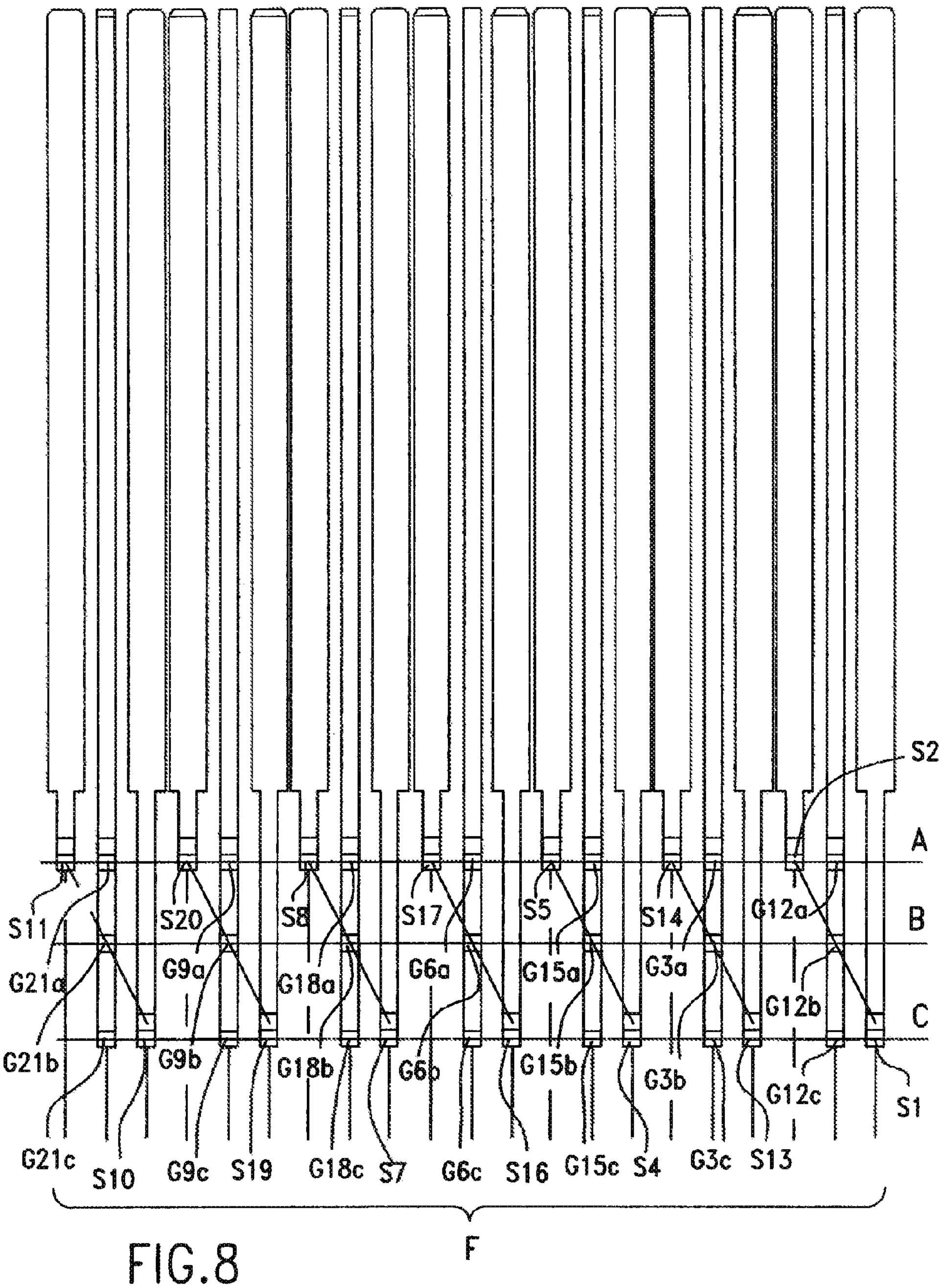
FIG. 8 shows a bottom plan view of the contacts of FIG. 6 showing the orientation of the contacts as they exit the rear side of the connector.

In a third embodiment as shown in FIGS. 6-8, FIG. 6 shows the routing of the contacts through the receptacle shell 24 and the insulator 22, which have been removed for sake of clarity, FIG. 7 shows two sets of signal contacts pairs and the associated return reference contacts G, and FIG. 8 shows a bottom view of the connector 20 showing the orientation of the contacts G, S as they exit the rear side of the connector 20. The contacts G, S are again numbered 1 to 21 and this numbering corresponds to the numbering of FIG. 1. It can be seen that the return reference contacts G and the signal contacts S, S are provided in a grid form which includes three rows A, B, C and a plurality of columns F which are perpendicular to the rows A, B, C. The respective signal contacts S are the only contacts provided in their respective column F and the respective return reference contacts G are the only contacts provided in their respective column F. As shown, the output end of each return reference contact G is widened into a blade. At the end of the blade, a plurality of tails, for example tails G6*a*, G6*b*, G6*c*, are formed. As shown, three such tails are provided. It is to be understood that the widened blade may one have one such tail (whether it be in the middle or proximate one of the edges), two such tails (whether it be the middle and proximate one of the edges, or proximate to both edges) or three such tails as shown for connection into the printed wiring board. As shown in FIG. 8, the widened tail of the return reference contact G is equidistantly arranged between the adjacent signal contacts S, S. As such, it can be seen that the adjacent pairs of signal contacts S, S alternate between upper row A and the lower row C, and the return reference contact G separates the adjacent pairs of signal contacts S, S. The diagonal lines as shown in FIG. 8 are still formed between the adjacent pairs of signal contacts S, S and its associated return reference contact G (it is to be understood that the lines do not represent electrical connections and merely show the diagonal line formation). This provides for a greater distance between adjacent pairs of signal contacts S, S than if the adjacent pairs of signal contacts S, S were all provided on the same row. In addition, all of the same polarity, for example positive, contacts are on the upper row A and all of the same polarity, for example negative, contacts are on the lower row C. As a result, the cross-talk between adjacent signal pairs is reduced than if the adjacent pairs of contacts were all provided on the same row. In addition, because the return reference contact G is between the signal contacts S, S in the respective signal pairs, an improved electrical coupling, more uniform impedance, and a reduction in cross-talk between the signal contacts S, S in the respective signal pairs is achieved. The widened blade formed on the end of the return reference contact G further improves the electrical coupling, more uniform impedance, and a reduction in cross-talk between the signal contacts S, S in the respective signal pairs. The ends of the signal contacts S and the tails of the return reference contacts G can be soldered to a plated through hole in an associated printed wiring board (not shown).

FIG. 8A shows a fourth embodiment which is a modification of the embodiment shown in FIG. 7. It can be seen that the return reference contacts G and the signal contacts S, S are provided in a grid form which includes three rows A, B, C and a plurality of columns F which are perpendicular to the rows A, B, C. In this embodiment, the widened blade is diagonally mounted between the adjacent signal contacts S, S. This may aid in manufacturing the printed wiring board by further spacing the return reference through holes from the signal through holes in the upper and lower rows. Again, three such tails are shown. It is to be understood that the widened blade may one have one such tail (whether it be in the middle or proximate one of the edges), two such tails (whether it be the middle and proximate one of the edges, or proximate to both edges) or three such tails for connection into the printed wiring board with the widened blade diagonally mounted between the adjacent signal contacts S, S. The diagonal lines are still formed between the adjacent pairs of signal contacts S, S and its associated return reference contact G (it is to be understood that the lines do not represent electrical connections and merely shows the diagonal line formation).

Figure 9:
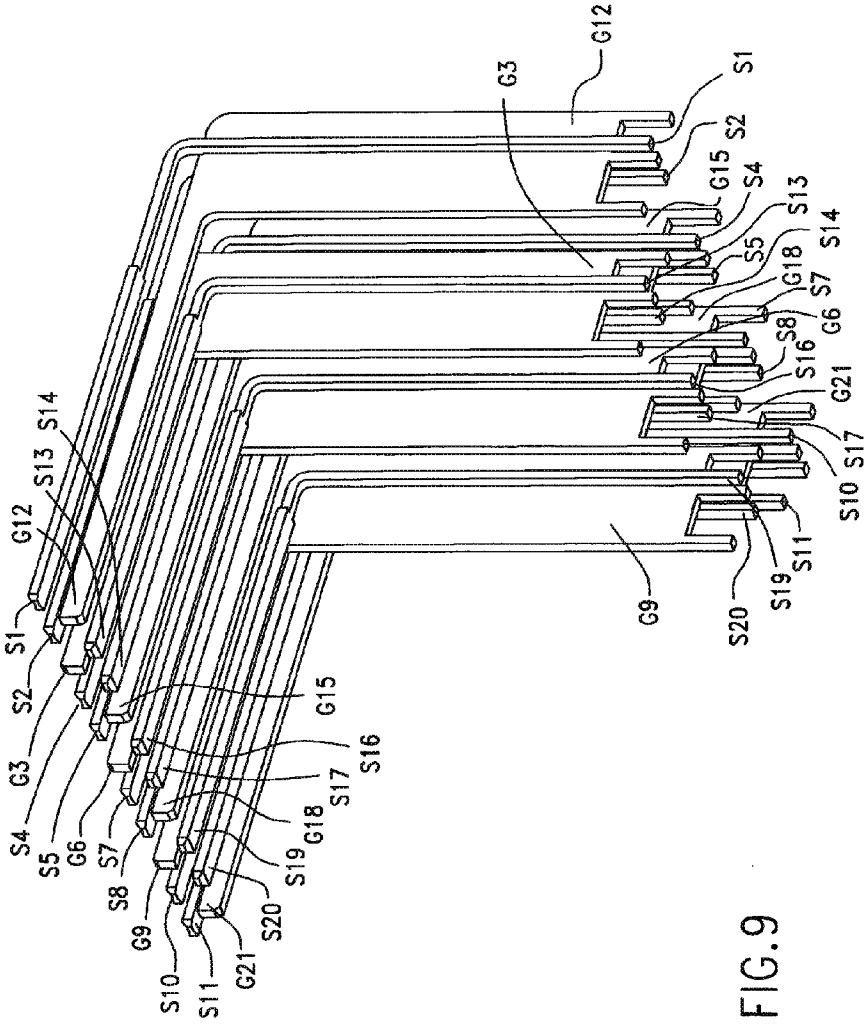
FIG. 9 is a perspective of the contacts shows the routing of the contacts through a receptacle shell and an insulator, which have been removed for sake of clarity, according to a fifth embodiment of the invention.
Figure 10:
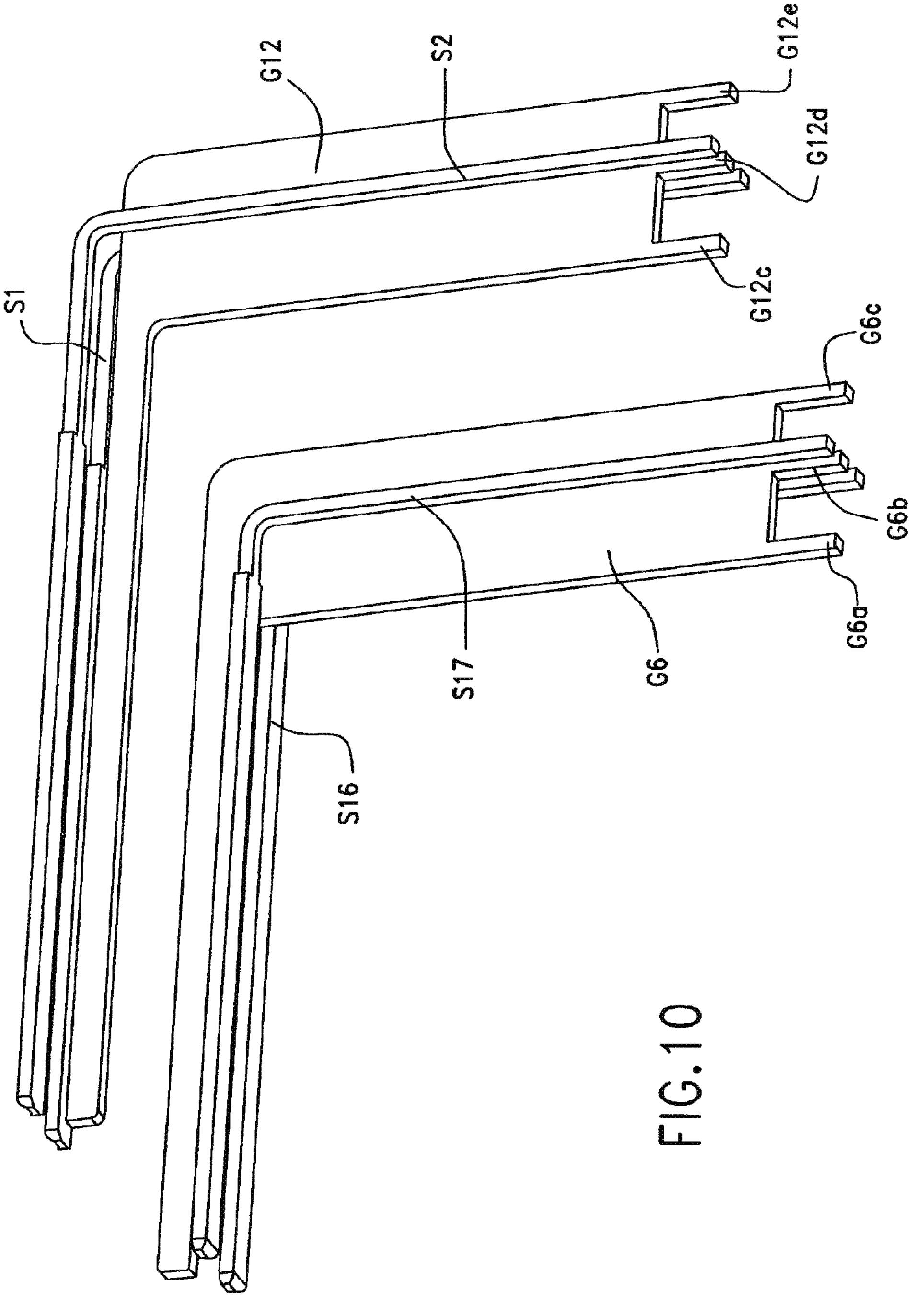
FIG. 10 is a perspective of two sets of the contacts shown in FIG. 9.
Figure 11:
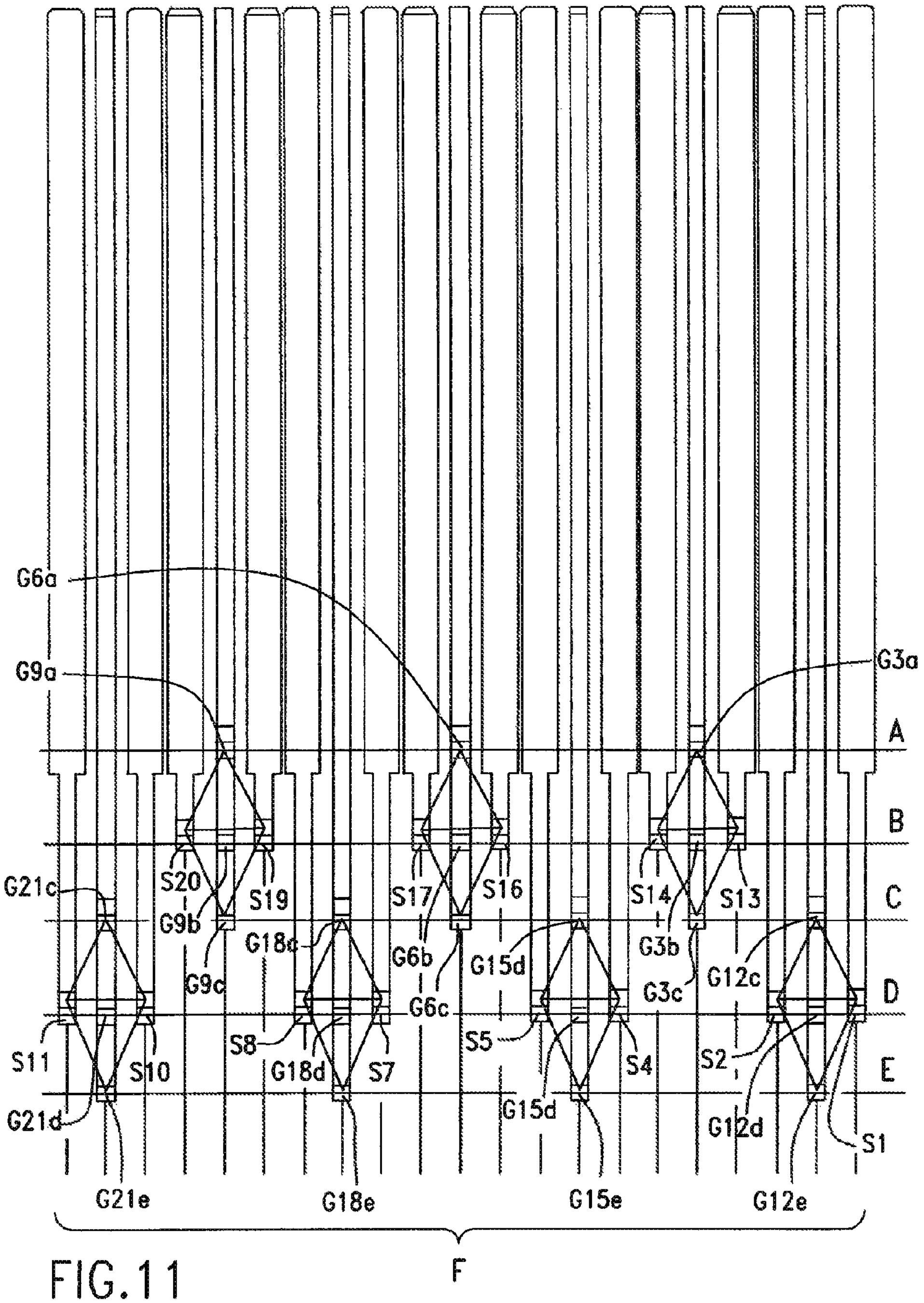
FIG. 11 shows a bottom plan view of the contacts of FIG. 9 showing the orientation of the contacts as they exit the rear side of the connector.

In a fifth embodiment as shown in FIGS. 9-11, FIG. 9 shows the routing of the contacts through the receptacle shell 24 and the insulator 22, which have been removed for sake of clarity, FIG. 10 shows two sets of signal pairs and the associated return reference contacts G, and FIG. 11 shows a bottom view of the connector 20 showing the orientation of the contacts G, S as they exit the rear side of the connector 20. The contacts G, S are again numbered 1 to 21 and this numbering corresponds to the numbering of FIG. 1. It can be seen that the return reference contacts G and the signal contacts S, S are provided in a grid form which includes five rows A, B, C, D, E and a plurality of columns F which are perpendicular to the rows A, B, C, D, E. The respective signal contacts S are the only contacts provided in their respective column F and the respective return reference contacts G are the only contacts provided in their respective column F. As shown, the output end of each return reference contact G is widened into a blade. At the end of the blade, a plurality of tails, for example G6*a*, G6*b*, G6*c*, are formed. As shown, three such tails are provided. It is to be understood that the widened blade may one have one such tail (whether it be in the middle or proximate one of the edges), two such tails (whether it be the middle and proximate one of the edges, or proximate to both edges) or three such tails for connection into the printed wiring board. As shown in FIG. 11, the widened tail is equidistantly arranged between the adjacent signal contacts S, S. As such, it can be seen that the adjacent pairs of signal contacts S, S alternate between the second row B and the fourth row D. The widened tails alternate between the third/fourth/lower rows and the upper/second/third rows. This provides for a greater distance between adjacent pairs of signal contacts S, S than if the adjacent pairs of signal contacts S, S were all provided on the same row. As a result, the cross-talk between adjacent signal pairs is reduced than if the adjacent pairs of contacts were all provided on the same row. In addition, because the return reference contact G is between the signal contacts S, S in the respective signal pairs, an improved electrical coupling, more uniform impedance, and a reduction in cross-talk between the signal contacts S, S in the respective signal pairs is achieved. The widened blade formed on the end of the return reference contact G further improves the electrical coupling, more uniform impedance, and a reduction in cross-talk between the signal contacts S, S in the respective signal pairs. The power contacts D are also provided in the rows, usually at the ends. The signal contacts S, S adjacent to each other in row B and the return reference contact G in row A or in row C are located at three apexes of an isosceles triangle as shown by the lines in FIG. 11 (it is to be understood that the lines do not represent electrical connections and merely shows the isosceles triangle formation). Likewise, the signal contacts S, S adjacent to each other in row D and the return reference contact G in row C or in row E are located at three apexes of an isosceles triangle as shown by the lines in FIG. 11 (it is to be understood that the lines do not represent electrical connections and merely shows the isosceles triangle formation). The ends of the signal contacts S and the tails of the return reference contacts G can be soldered to a plated through hole in an associated printed wiring board (not shown).

Figure 12:
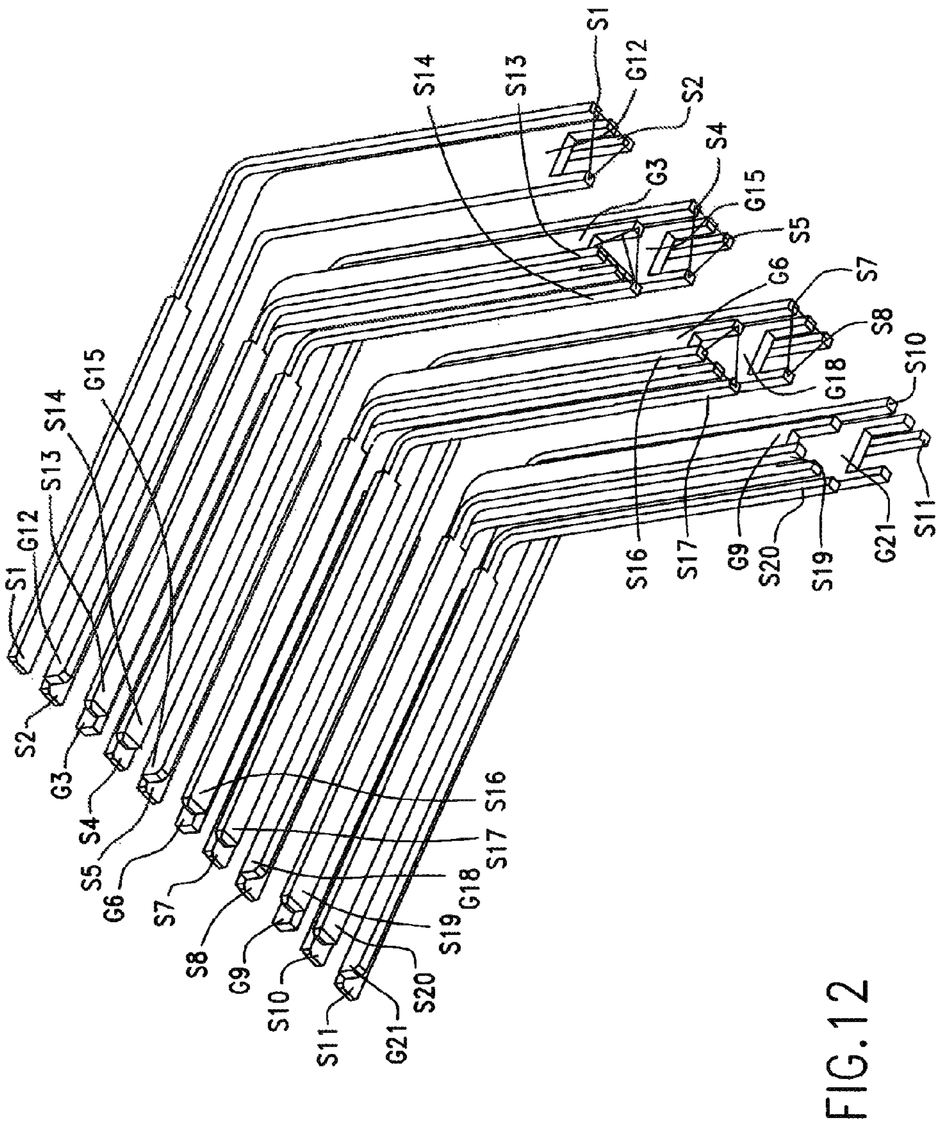
FIG. 12 is a perspective of the contacts shows the routing of the contacts through a receptacle shell and an insulator, which have been removed for sake of clarity, according to a sixth embodiment of the invention.
Figure 13:
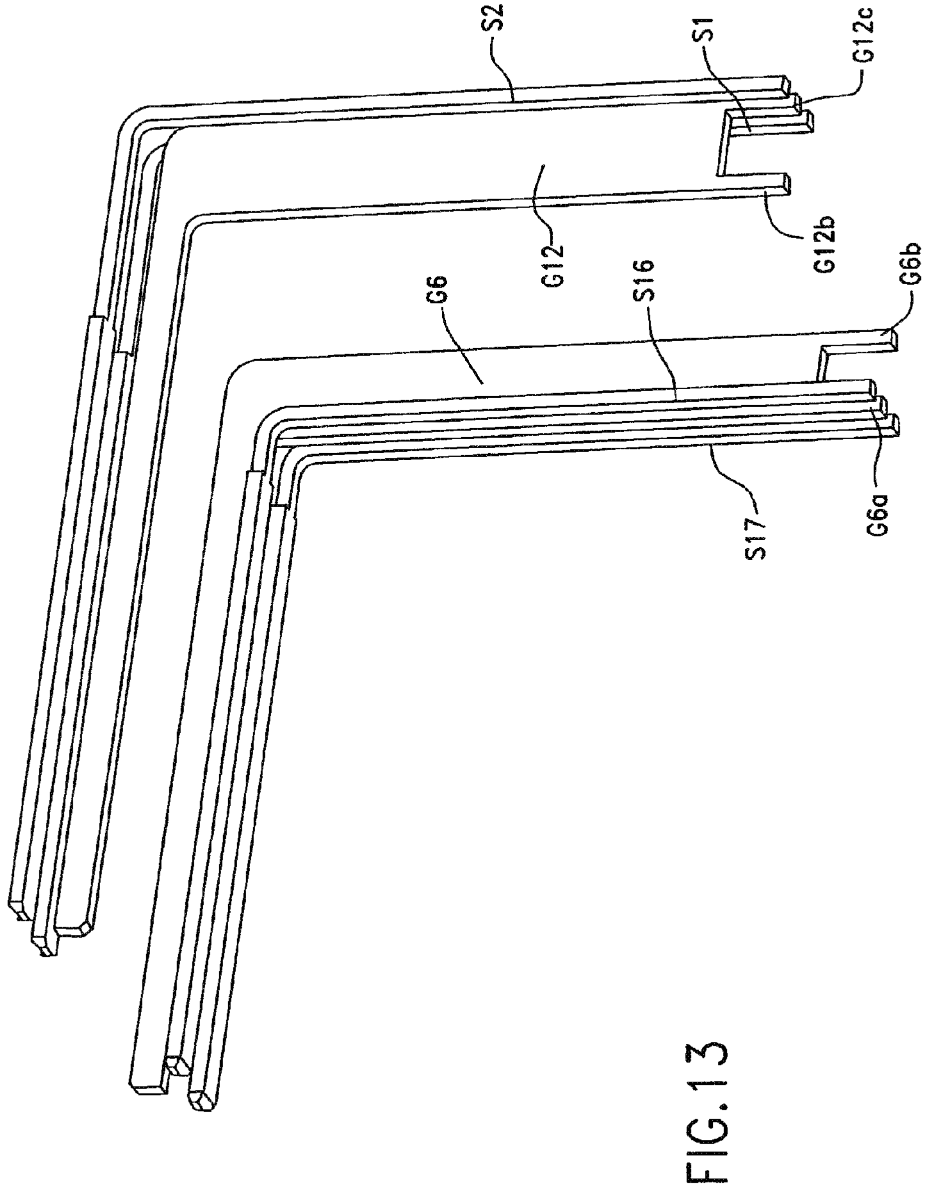
FIG. 13 is a perspective of two sets of the contacts shown in FIG. 12.
Figure 14:
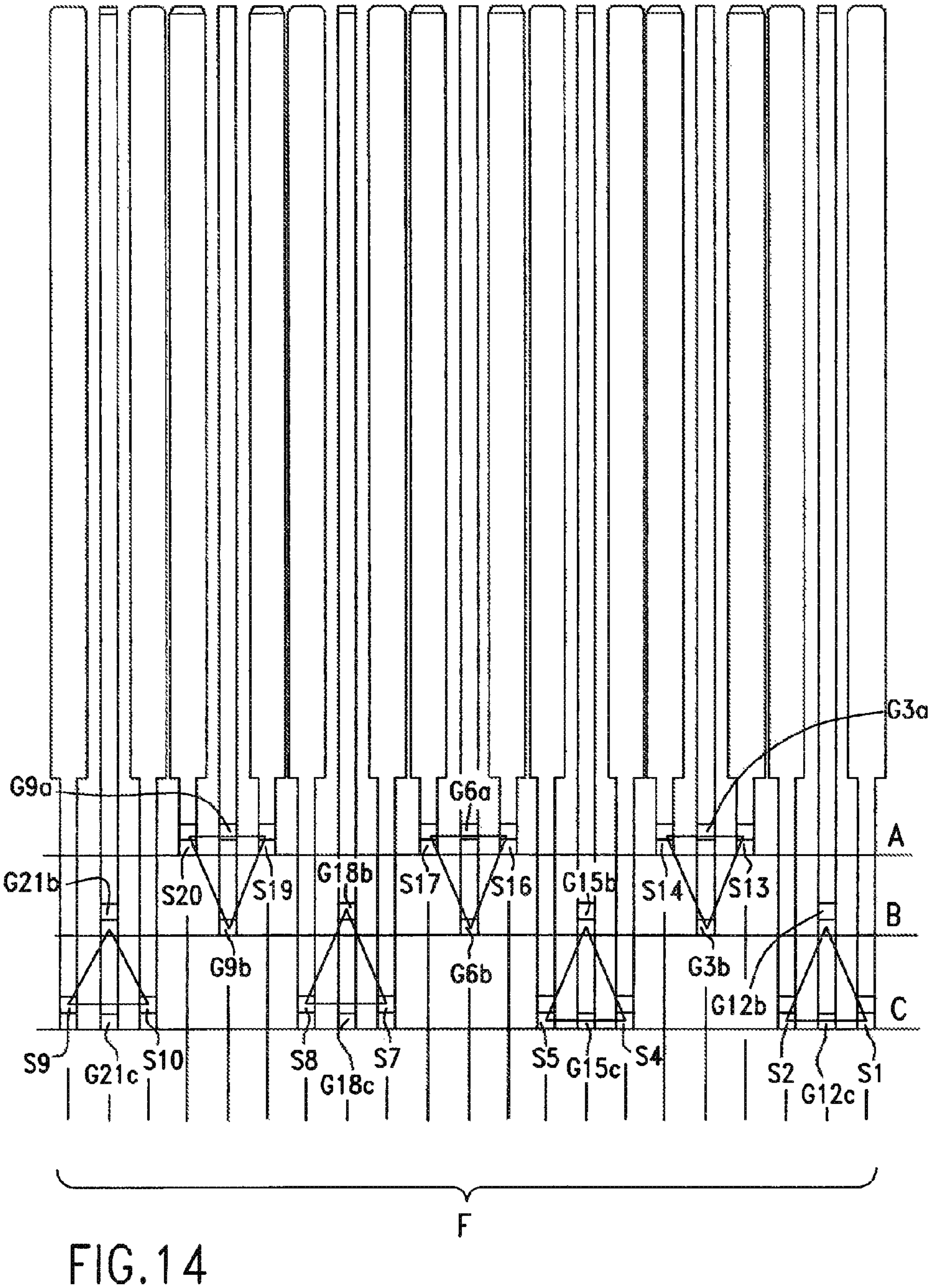
FIG. 14 shows a bottom plan view of the contacts of FIG. 12 showing the orientation of the contacts as they exit the rear side of the connector.

In a sixth embodiment as shown in FIGS. 12-14, FIG. 12 shows the routing of the contacts through the receptacle shell 24 and the insulator 22, which have been removed for sake of clarity, FIG. 13 shows two sets of signal pairs and the associated return reference contacts G, and FIG. 14 shows a bottom view of the connector 20 showing the orientation of the contacts G, S as they exit the rear side of the connector 20. The contacts G, S are again numbered 1 to 21 and this numbering corresponds to the numbering of FIG. 1. It can be seen that the return reference contacts G and the signal contacts S, S are provided in a grid form which includes three rows A, B, C and a plurality of columns F which are perpendicular to the rows A, B, C. The respective signal contacts S are the only contacts provided in their respective column F and the respective return reference contacts G are the only contacts provided in their respective column F. As shown, the output end of each return reference contact G is widened into a blade. At the end of the blade, a plurality of tails, for example G6*a*, G6*b*, are formed and as shown, two such tails are provided. It is to be understood that the widened blade may one have one such tail for connection into the printed wiring board. As shown in FIG. 14, the widened tail is equidistantly arranged between the adjacent signal contacts S, S. As such, it can be seen that the adjacent pairs of signal contacts S, S alternate between the upper row A and the lower row C. The return reference contacts G alternate between the middle/lower rows B, C and the upper/middle rows A, B. This provides for a greater distance between adjacent pairs of signal contacts S, S than if the adjacent pairs of signal contacts S, S were all provided on the same row. As a result, the cross-talk between adjacent signal pairs is reduced than if the adjacent pairs of contacts were all provided on the same row. In addition, because the return reference contact G is between the signal contacts S, S in the respective signal pairs, an improved electrical coupling, more uniform impedance, and a reduction in cross-talk between the signal contacts S, S in the respective signal pairs is achieved. The widened blade formed on the end of the return reference contact G further improves the electrical coupling, more uniform impedance, and a reduction in cross-talk between the signal contacts S, S in the respective signal pairs. Each pair of signal contacts S, S and the associated return reference contact G form the apexes of an isosceles triangle as shown by the line in FIG. 14 (it is to be understood that line does not represent an electrical connection and merely shows the isosceles triangle formation). The ends of the signal contacts S and the tails of the return reference contacts G can be soldered to a plated through hole in an associated printed wiring board (not shown).

Figure 15:
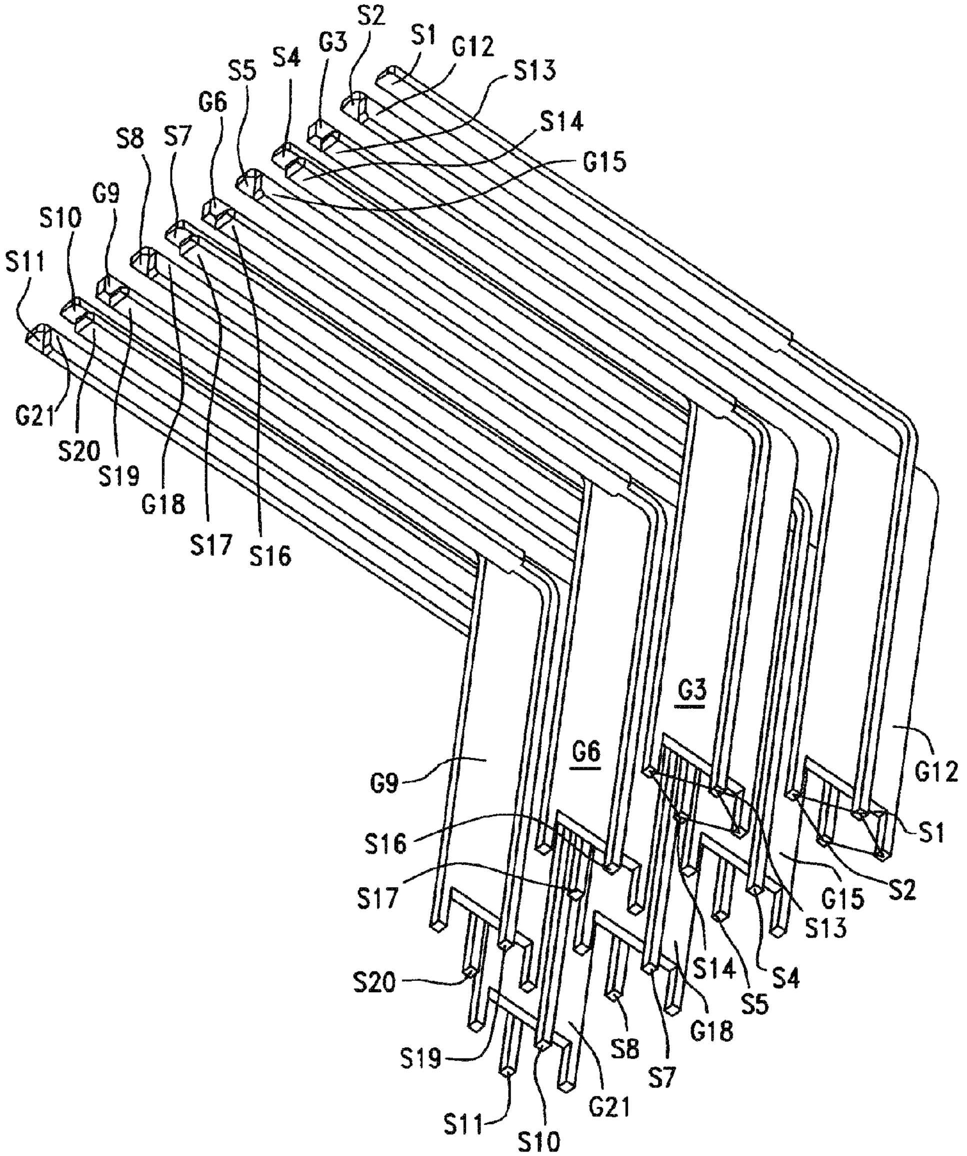
FIG. 15 is a perspective of the contacts shows the routing of the contacts through a receptacle shell and an insulator, which have been removed for sake of clarity, according to a seventh embodiment of the invention.
Figure 16:
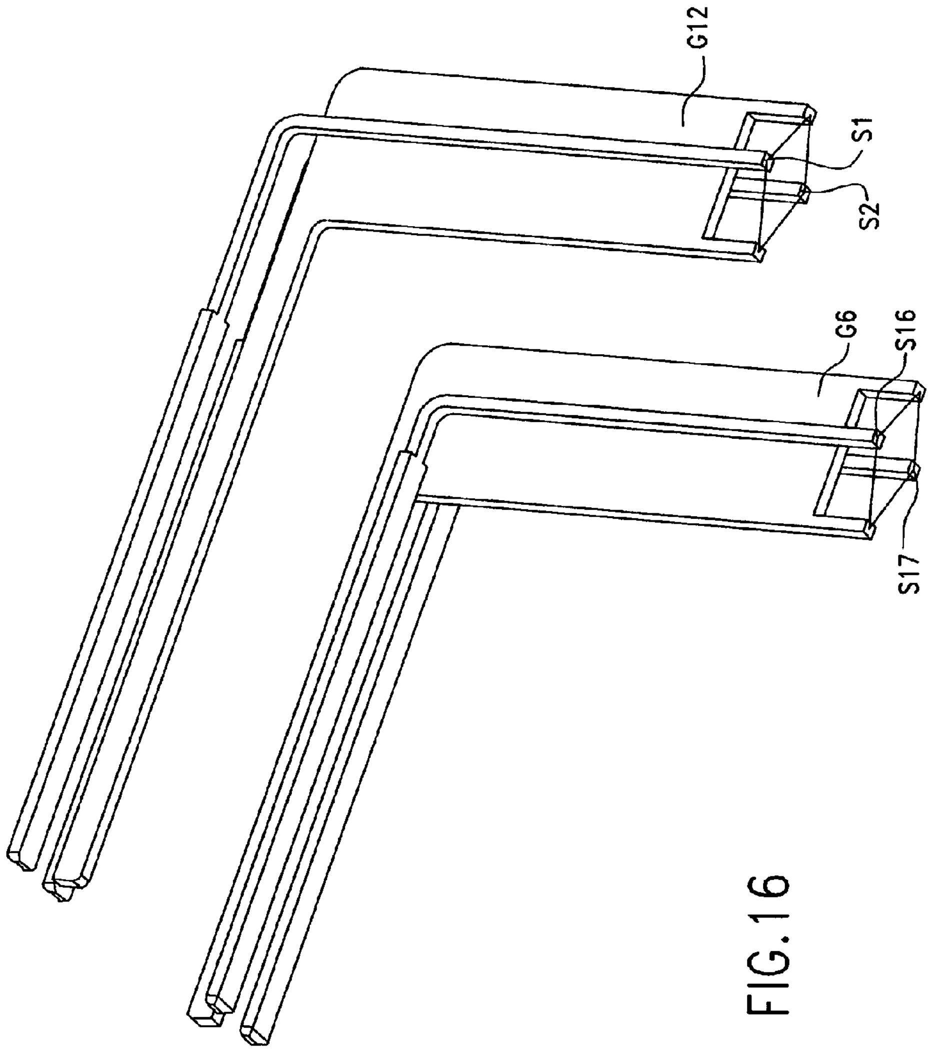
FIG. 16 is a perspective of two sets of the contacts shown in FIG. 15.
Figure 17:
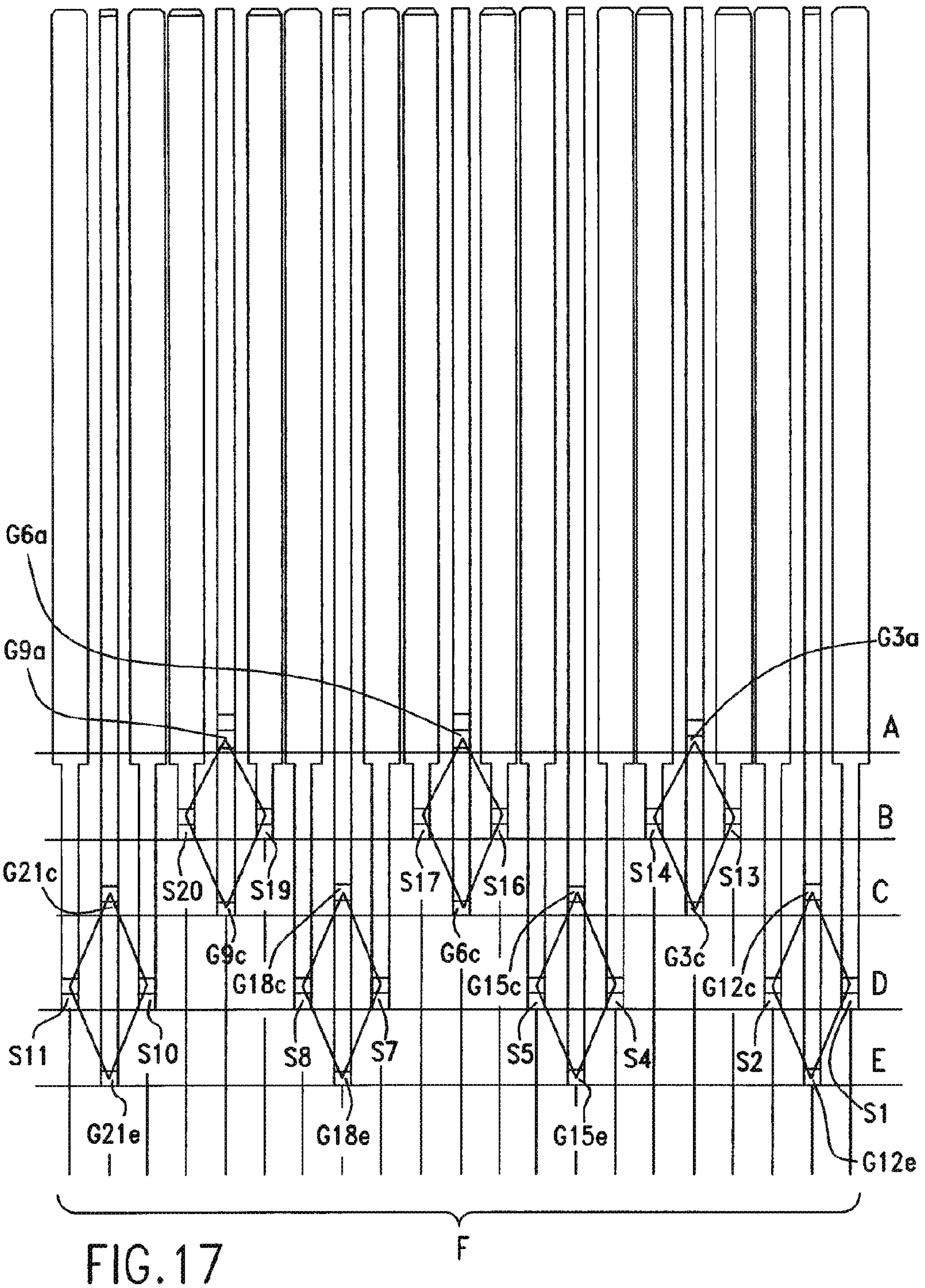
FIG. 17 shows a bottom plan view of the contacts of FIG. 15 showing the orientation of the contacts as they exit the rear side of the connector.

In a seventh embodiment as shown in FIGS. 15-17, FIG. 15 shows the routing of the contacts through the receptacle shell 24 and the insulator 22, which have been removed for sake of clarity, FIG. 16 shows two sets of signal pairs and the associated return reference contacts G, and FIG. 17 shows a bottom view of the connector 20 showing the orientation of the contacts G, S as they exit the rear side of the connector 20. The contacts G, S are again numbered 1 to 21 and this numbering corresponds to the numbering of FIG. 1. It can be seen that the return reference contacts G and the signal contacts S, S are provided in a grid form which includes five rows A, B, C, D, E and a plurality of columns F which are perpendicular to the rows A, B, C, D, E. The respective signal contacts S are the only contacts provided in their respective column F and the respective return reference contacts G are the only contacts provided in their respective column F. As shown, the output end of each return reference contact G is widened into a blade. At the end of the blade, a plurality of tails, for example G6*a*, G6*c*, are formed and as shown, two such tails are provided. It is to be understood that the widened blade may one have one such tail for connection into the printed wiring board. As shown in FIG. 17, the widened tail is equidistantly arranged between the adjacent signal contacts S, S. As such, it can be seen that the adjacent pairs of signal contacts S, S alternate between the second row B and the fourth row D. The return reference contacts G alternate between the third/lower rows C, E and the upper/third rows A, C. This provides for a greater distance between adjacent pairs of signal contacts S, S than if the adjacent pairs of signal contacts S, S were all provided on the same row. As a result, the cross-talk between adjacent signal pairs is reduced than if the adjacent pairs of contacts were all provided on the same row. In addition, because the return reference contact G is between the signal contacts S, S in the respective signal pairs, an improved electrical coupling, more uniform impedance, and a reduction in cross-talk between the signal contacts S, S in the respective signal pairs is achieved. The widened blade formed on the end of the return reference contact G further improves the electrical coupling, more uniform impedance, and a reduction in cross-talk between the signal contacts S, S in the respective signal pairs The signal contacts S, S adjacent to each other in row B and the return reference contact G in row A or in row C are located at three apexes of an isosceles triangle as shown by the lines in FIG. 17 (it is to be understood that the lines do not represent electrical connections and merely shows the isosceles triangle formation). Likewise, the signal contacts S, S adjacent to each other in row D and the return reference contact G in row C or in row E are located at three apexes of an isosceles triangle as shown by the lines in FIG. 17 (it is to be understood that the lines do not represent electrical connections and merely shows the isosceles triangle formation). The ends of the signal contacts S and the tails of the return reference contacts G can be soldered to a plated through hole in an associated printed wiring board (not shown).

Figure 18:
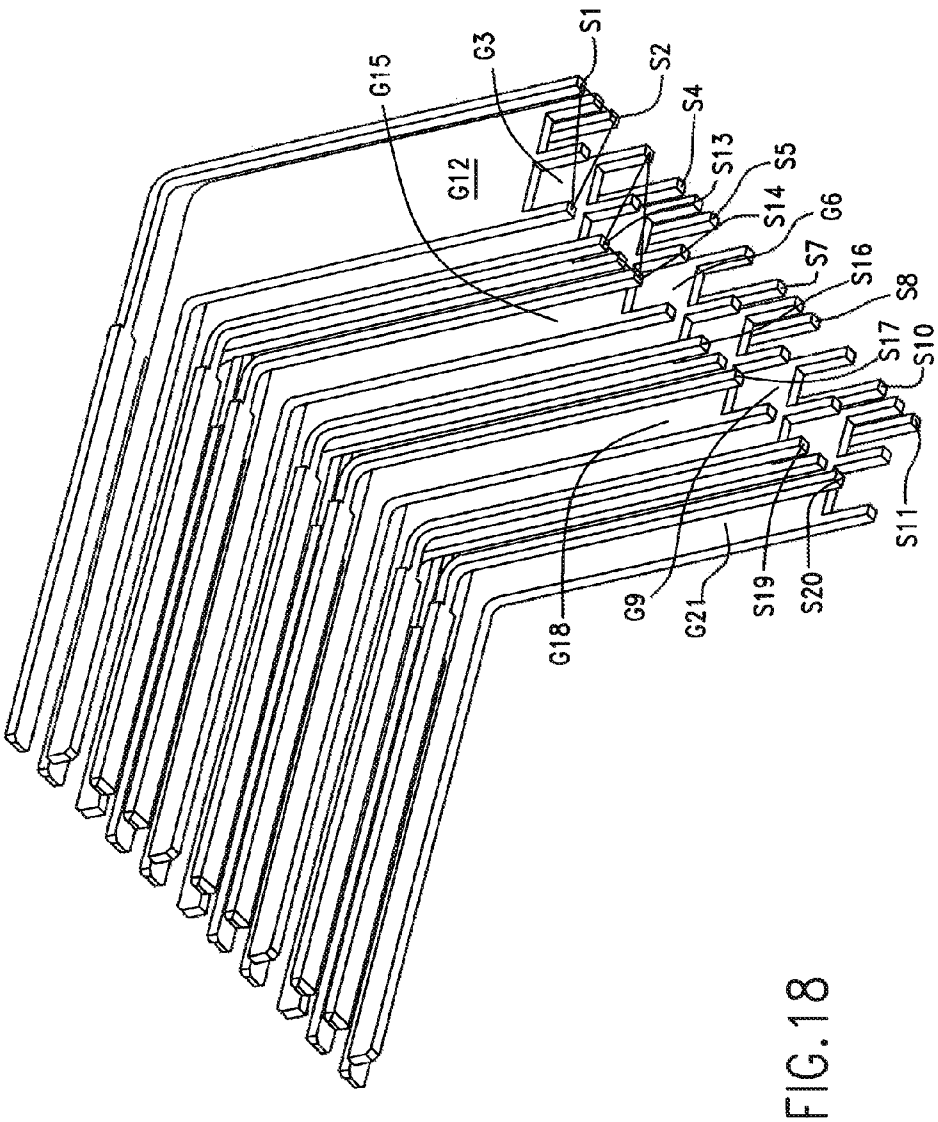
FIG. 18 is a perspective of the contacts shows the routing of the contacts through a receptacle shell and an insulator, which have been removed for sake of clarity, according to a eighth embodiment of the invention.
Figure 19:
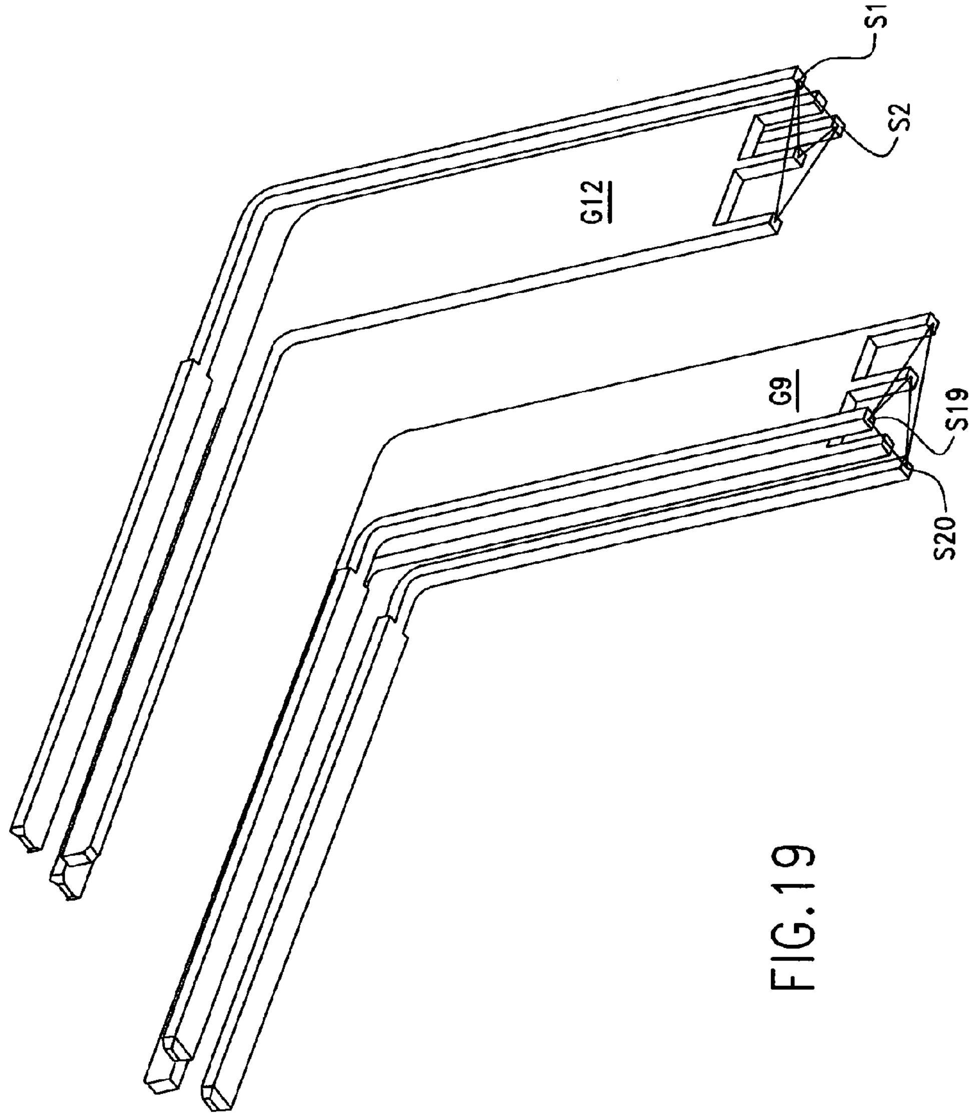
FIG. 19 is a perspective of two sets of the contacts shown in FIG. 18.
Figure 20:
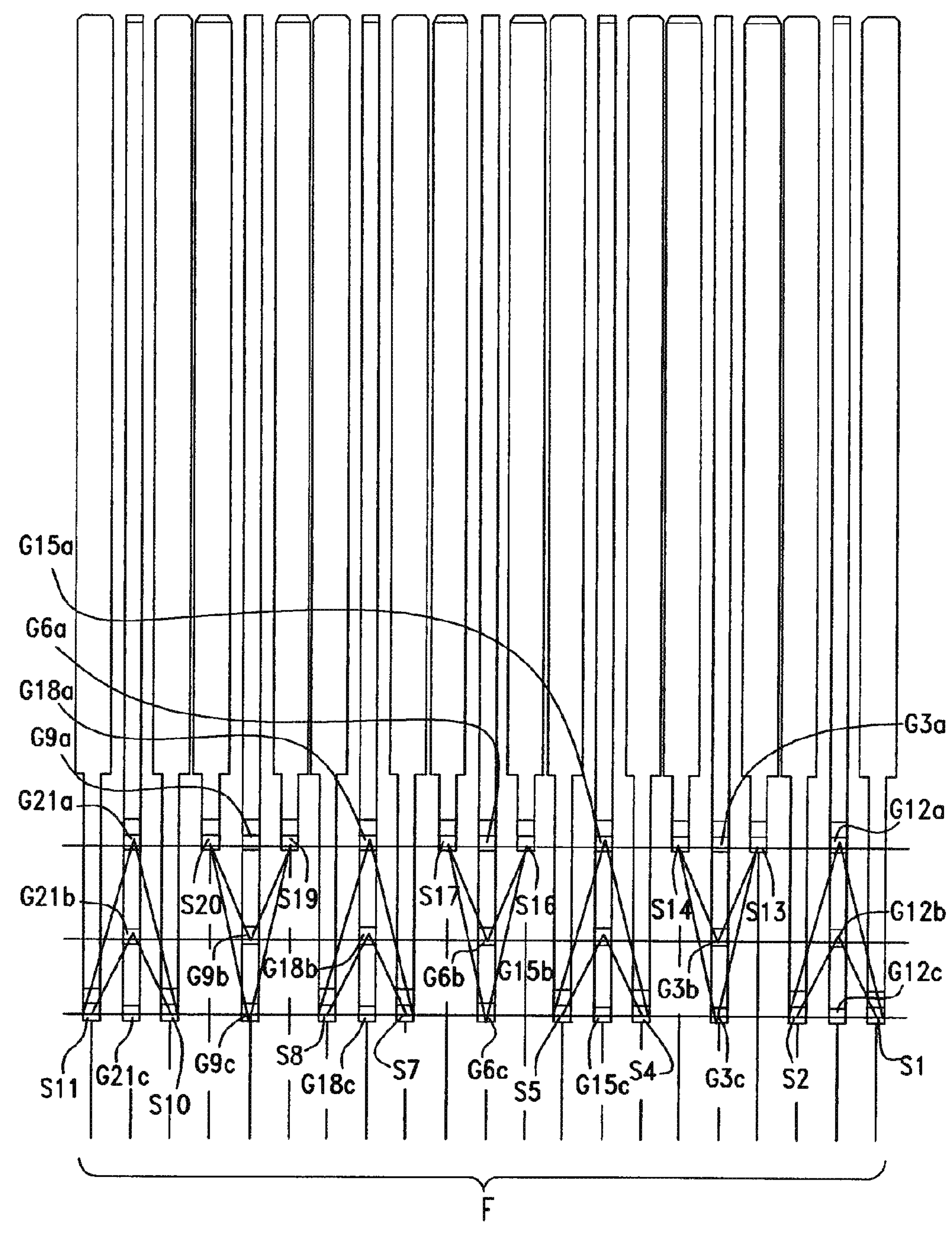
FIG. 20 shows a bottom plan view of the contacts of FIG. 18 showing the orientation of the contacts as they exit the rear side of the connector.

In an eighth embodiment as shown in FIGS. 18-20, FIG. 18 shows the routing of the contacts through the receptacle shell 24 and the insulator 22, which have been removed for sake of clarity, FIG. 19 shows two sets of signal pairs and the associated return reference contacts G, and FIG. 20 shows a bottom view of the connector 20 showing the orientation of the contacts G, S as they exit the rear side of the connector 20. The contacts G, S are again numbered 1 to 21 and this numbering corresponds to the numbering of FIG. 1. It can be seen that the return reference contacts G and the signal contacts S, S are provided in a grid form which includes three rows A, B, C and a plurality of columns F which are perpendicular to the rows A, B, C. The respective signal contacts S are the only contacts provided in their respective column and the respective return reference contacts G are the only contacts provided in their respective columns. As shown, the output end of each return reference contact G is widened into a blade. At the end of the blade, a plurality of tails, for example G6*a*, G6*b*, G6*c*, are formed. As shown, three such tails are provided. It is to be understood that the widened blade may one have one such tail (whether it be in the middle or proximate one of the edges), two such tails (whether it be the middle and proximate one of the edges, or proximate to both edges) or three such tails for connection into the printed wiring board. As shown in FIG. 20, the widened tail is equidistantly arranged between the adjacent signal contacts S, S. As such, it can be seen that the adjacent pairs of signal contacts S, S alternate between upper row A and the lower row C, and the return reference contact G separates the adjacent pairs of signal contacts S, S. The return reference contact G is provided in all three rows. This provides for a greater distance between adjacent pairs of signal contacts S, S than if the adjacent pairs of signal contacts S, S were all provided on the same row. As a result, the cross-talk between adjacent signal pairs is reduced than if the adjacent pairs of contacts were all provided on the same row. In addition, because the return reference contact G is between the signal contacts S, S in the respective signal pairs, an improved electrical coupling, more uniform impedance, and a reduction in cross-talk between the signal contacts S, S in the respective signal pairs is achieved. The widened blade formed on the end of the return reference contact G further improves the electrical coupling, more uniform impedance, and a reduction in cross-talk between the signal contacts S, S in the respective signal pairs. The signal contacts S, S adjacent to each other in row A and the return reference contact G in row B or in row C are located at three apexes of an isosceles triangle as shown by the lines in FIG. 20 (it is to be understood that the lines do not represent electrical connections and merely shows the isosceles triangle formation). Likewise, the signal contacts S, S adjacent to each other in row C and the return reference contact G in row A or in row B are located at three apexes of an isosceles triangle as shown by the lines in FIG. 20 (it is to be understood that the lines do not represent electrical connections and merely shows the isosceles triangle formation). The ends of the signal contacts S and the tails of the return reference contacts G can be soldered to a plated through hole in an associated printed wiring board (not shown).

Figure 21:
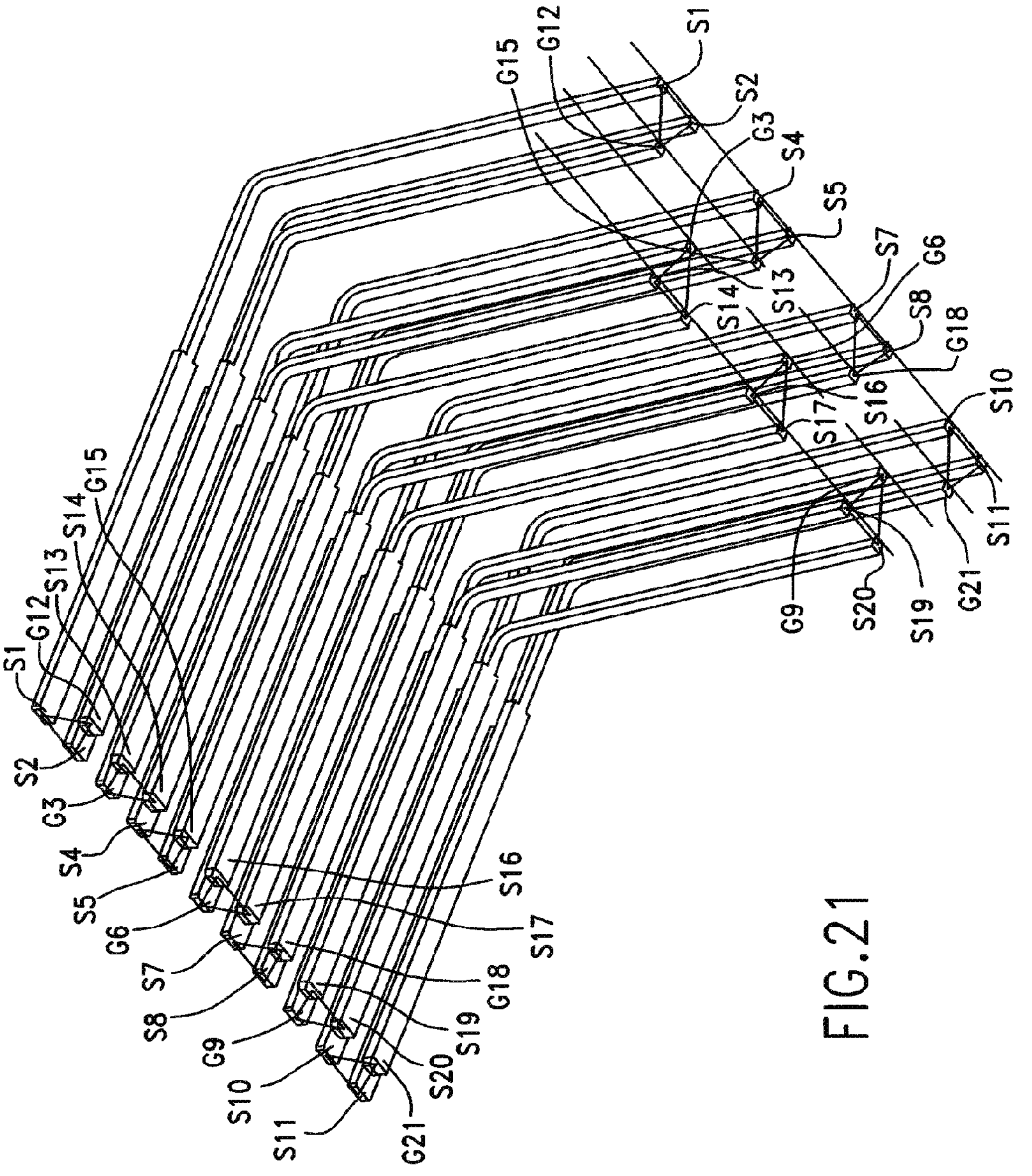
FIG. 21 is a perspective of the contacts shows the routing of the contacts through a receptacle shell and an insulator, which have been removed for sake of clarity, according to a ninth embodiment of the invention.
Figure 22:
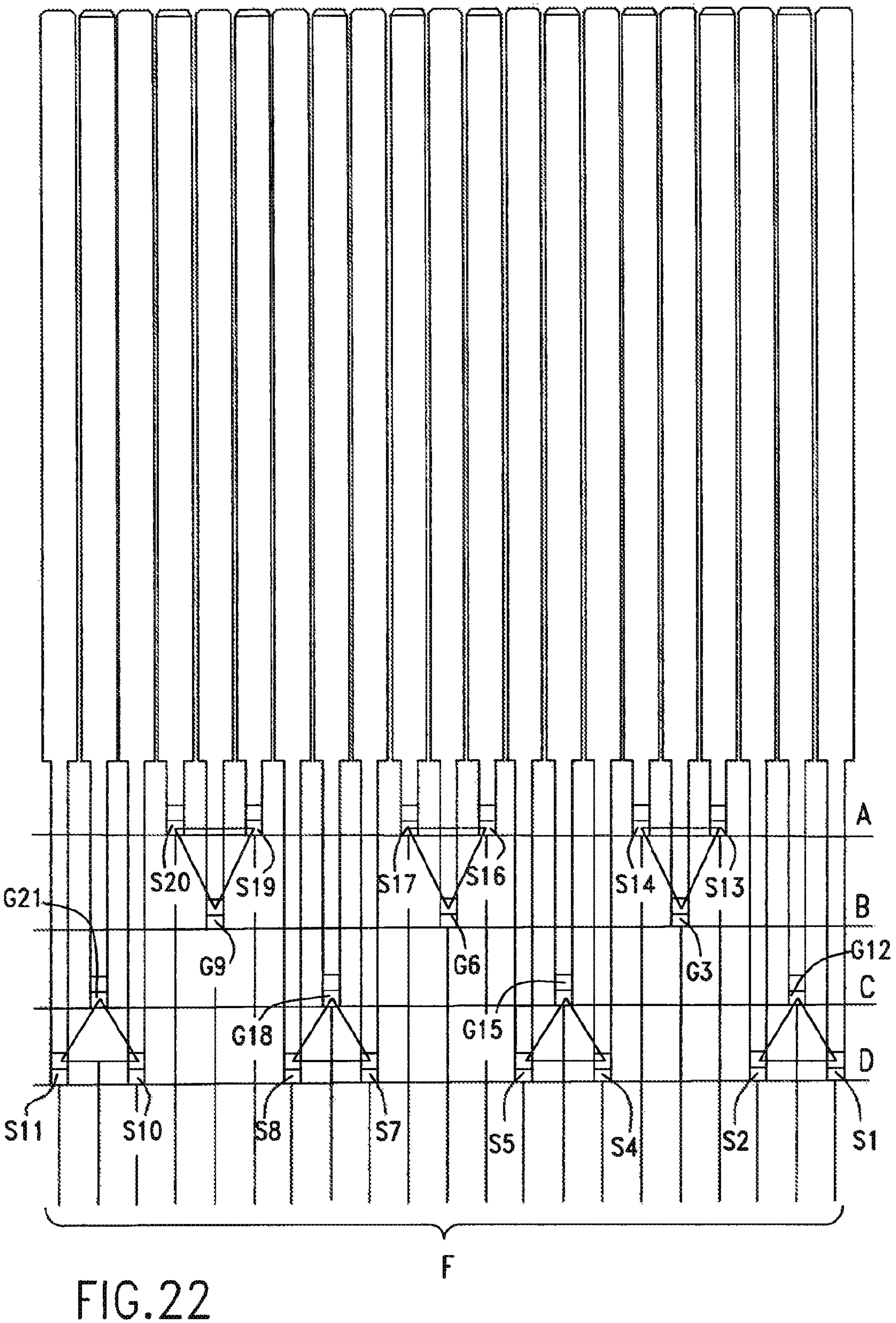
FIG. 22 shows a bottom plan view of the contacts of FIG. 21 showing the orientation of the contacts as they exit the rear side of the connector.

In a ninth embodiment as shown in FIGS. 21 and 22, FIG. 21 shows the routing of the contacts through the receptacle shell 24 and the insulator 22, which have been removed for sake of clarity, and FIG. 22 shows a bottom view of the connector 20 showing the orientation of the contacts G, S as they exit the rear side of the connector 20. The contacts G, S are again numbered 1 to 21 and this numbering corresponds to the numbering of FIG. 1. It can be seen that the return reference contacts G and the signal contacts S, S are provided in a grid form which includes four rows A, B, C, D and a plurality of columns F which are perpendicular to the rows A, B, C, D. The respective signal contacts S are the only contacts provided in their respective column F and the respective return reference contacts G are the only contacts provided in their respective column F. As such, it can be seen that the return reference contacts G alternate between the second row B and the third row C; and the adjacent pairs of contacts alternate between upper row A and lower row D. Each pair of signal contacts S, S and the associated return reference contact G form an isosceles triangle as shown by the lines in FIG. 22 (it is to be understood that the lines do not represent electrical connections and merely shows the isosceles triangle formation). This provides for a greater distance between return reference contacts G than if the return reference contacts G were all provided on the same row; this provides for a greater distance between adjacent pairs of signal contacts S, S than if the adjacent pairs of signal contacts S, S were all provided on the same row. As a result, the cross-talk between adjacent signal pairs is reduced than if the adjacent pairs of contacts were all provided on the same row. In addition, because the return reference contact G is between the signal contacts S, S in the respective signal pairs, an improved electrical coupling, more uniform impedance, and a reduction in cross-talk between the signal contacts S, S in the respective signal pairs is achieved. The contacts G, S can be soldered to a plated through hole in an associated printed wiring board (not shown).

While preferred embodiments of the present invention are shown and described, it is envisioned that those skilled in the art may devise various modifications of the present invention without departing from the spirit and scope of the appended claims.

The invention claimed is:

1. A connector comprising:

an insulator having a front face; and a plurality of spaced apart signal contacts and return reference contacts held and routed through the insulator, the signal contacts forming signal pairs which includes a positive signal contact and a negative signal contact, at the front face each signal pair is separated from an adjacent signal pair by one of the return reference contacts in an upper row, and each signal pair is separated from an adjacent signal pair by one of the return reference contacts in a lower row, extending from the insulator opposite the front face, the signal contacts and the return reference contacts arranged in a grid comprised of at least three rows and a plurality of columns, wherein a plurality of isosceles triangles are formed by the grid such that a signal pair is provided on one of the rows and one of the return reference contact provided on an another one of the rows, the signal contacts being the only contacts provided in its respective column, the return reference contacts being the only contacts provided in its respective column, adjacent signal pairs alternating between two different rows in the grid, wherein three rows are provided by the grid and the signal pairs in the isosceles triangles alternate between the first and second rows and the return reference contacts in the isosceles triangles alternate between the second and third rows.

2. A connector, comprising:

an insulator having a front face; and a plurality of spaced apart signal contacts and return reference contacts held and routed through the insulator, the signal contacts forming signal pairs which includes a positive signal contact and a negative signal contact, at the front face each signal pair is separated from an adjacent signal pair by one of the return reference contacts in an upper row, and each signal pair is separated from an adjacent signal pair by one of the return reference contacts in a lower row, extending from the insulator opposite the front face, the signal contacts and the return reference contacts arranged in a grid comprised of at least three rows and a plurality of columns, wherein a plurality of isosceles triangles are formed by the grid such that a signal pair is provided on one of the rows and one of the return reference contact provided on an another one of the rows, the signal contacts being the only contacts provided in its respective column, the return reference contacts being the only contacts provided in its respective column, adjacent signal pairs alternating between two different rows in the grid, wherein a first row, a second row, a third row, a fourth row and a fifth row are provided by the grid, the signal pairs in the isosceles triangles alternating between the second and fourth rows and the return reference contacts in the isosceles triangles alternating between the third and fifth rows.

3. The connector as defined in claim 2, wherein each return reference contact is formed as a widened blade which spans at least two rows, the widened blade having a tail extending therefrom, the tail forming the isosceles triangles.

4. The connector as defined in claim 2, wherein each return reference contact is formed as a widened blade which spans three rows, the widened blade having three tails extending therefrom, a first one of the tails which is at a first end of the widened blade forming a first isosceles triangle, a second one of the tails which is in a middle of the widened blade being in the same row as the respective signal pair, and a third one of the tails which is at a second end of the widened blade being on the row adjacent the row on which the second tail is located to form a second isosceles triangle.

5. The connector as defined in claim 2, wherein each return reference contact is formed as a widened blade which spans three rows, the widened blade having two tails extending therefrom, a first one of the tails which is at a first end of the widened blade forming the isosceles triangles, and a second one of the tails which is at a second end of the widened blade being in the row adjacent the row on which the signal pair is located to form a second isosceles triangle.

6. A connector, comprising:

an insulator having a front face; and a plurality of spaced apart signal contacts and return reference contacts held and routed through the insulator, the signal contacts forming signal pairs which includes a positive signal contact and a negative signal contact, at the front face each signal pair is separated from an adjacent signal pair by one of the return reference contacts in an upper row, and each signal pair is separated from an adjacent signal pair by one of the return reference contacts in a lower row, extending from the insulator opposite the front face, the signal contacts and the return reference contacts arranged in a grid comprised of at least three rows and a plurality of columns, wherein a plurality of isosceles triangles are formed by the grid such that a signal pair is provided on one of the rows and one of the return reference contact provided on an another one of the rows, the signal contacts being the only contacts provided in its respective column, the return reference contacts being the only contacts provided in its respective column, adjacent signal pairs alternating between two different rows in the grid, the signal pairs in the isosceles triangles alternate between the first and third rows and the return reference contacts in the isosceles triangles are provided in the second row, wherein each return reference contact is formed as a widened blade which spans two rows, the widened blade having two tails extending therefrom, a first one of the tails which is at a first end of the widened blade being in the same row as the respective signal pair, and a second one of the tails which is at a second end of the widened blade being on the row adjacent the row on which the first tail is located.

7. A connector, comprising:

an insulator having a front face; and a plurality of spaced apart signal contacts and return reference contacts held and routed through the insulator, the signal contacts forming signal pairs which includes a positive signal contact and a negative signal contact, at the front face each signal pair is separated from an adjacent signal pair by one of the return reference contacts in an upper row, and each signal pair is separated from an adjacent signal pair by one of the return reference contacts in a lower row, extending from the insulator opposite the front face, the signal contacts and the return reference contacts arranged in a grid comprised of at least three rows and a plurality of columns, wherein a plurality of isosceles triangles are formed by the grid such that a signal pair is provided on one of the rows and one of the return reference contact provided on an another one of the rows, the signal contacts being the only contacts provided in its respective column, the return reference contacts being the only contacts provided in its respective column, adjacent signal pairs alternating between two different rows in the grid, the signal pairs in the isosceles triangles alternate between the first and third rows and the return reference contacts in the isosceles triangles are provided in the second row, wherein each the return reference contact is formed as a widened blade which spans three rows, the widened blade having three tails extending therefrom, a first one of the tails which is at a first end of the widened blade being in the same row as the respective signal pair, a second one of the tails which is in a middle of the widened blade forming the isosceles triangles, and a third one of the tails which is at a second end of the widened blade being on the row adjacent the row on which the second tail is located and forming a second isosceles triangles with the respective signal pair.

8. A connector, comprising:

an insulator having a front face; and a plurality of spaced apart signal contacts and return reference contacts held and routed through the insulator, the signal contacts forming signal pairs which includes a positive signal contact and a negative signal contact, at the front face each signal pair is separated from an adjacent signal pair by one of the return reference contacts in an upper row, and each signal pair is separated from an adjacent signal pair by one of the return reference contacts in a lower row, extending from the insulator opposite the front face, the signal contacts and the return reference contacts arranged in a grid comprised of a first row, a second row, a third row and a fourth row and a plurality of columns, wherein a plurality of isosceles triangles are formed by the grid such that a signal pair is provided on one of the rows and one of the return reference contact provided on an another one of the rows, the signal contacts being the only contacts provided in its respective column, the return reference contacts being the only contacts provided in its respective column, adjacent signal pairs alternating between two different rows in the grid, the signal pairs in the isosceles triangles alternating between the first and fourth rows and the return reference contacts in the isosceles triangles alternating between the second and third rows.

9. A connector comprising:

an insulator having a front face; and a plurality of spaced apart signal contacts and return reference contacts held and routed through the insulator, the signal contacts forming signal pairs which includes a positive signal contact and a negative signal contact, at the front face each signal pair is separated from an adjacent signal pair by one of the return reference contacts in an upper row and each signal pair is separated from an adjacent signal pair by one of the return reference contacts in a lower row, extending from the insulator opposite the front face, the signal contacts and the return reference contacts being arranged in a grid which includes a first row, a second row and a third row and a plurality of columns, wherein a plurality of diagonal lines are formed in the grid which includes a signal pair having one of the signal contacts provided in the first row and the other of the signal contacts provided in the third row and one of the return reference contacts provided in the second row, the return reference contact being provided between the signal contacts in the signal pair in a column offset from the columns in which the signal contacts are provided; wherein each return reference contact is formed as a widened blade which spans the first, second and third rows, the widened blade having at least one tail extending therefrom.

10. The connector as defined in claim 9, wherein each widened blade has three tails extending therefrom, the first tail being in the first row, the second tail being in the second row, and the third tail being in the third row, the second tail forming return reference contact in the diagonal line.

11. The connector as defined in claim 10, wherein each widened blade is angled such that the first tail is in the column of one of the signal contacts, the second tail is provided in the column which is offset from the signal contacts in the diagonal line, and the third tail is in the column of the other of the signal contacts.

12. The connector as defined in claim 9, wherein each tail is provided in a column which is offset from the signal contacts in the diagonal line.

* * * * *